US012703621B2

(12) United States Patent
Silvestre

(10) Patent No.: US 12,703,621 B2
(45) Date of Patent: Aug. 11, 2026

(54) MEMS PRESSURE SENSOR BUILT USING THE BEOL METAL LAYERS OF A SOLID-STATE SEMICONDUCTOR PROCESS

(71) Applicant: Nanusens SL, Cerdanyola del Vallès (ES)

(72) Inventor: Josep Montanyà Silvestre, Cerdanyola del Vallès (ES)

(73) Assignee: Nanusens SL, Cerdanyola del Valles (ES)

(*) Notice: Subject to any disclaimer, the term of this patent is extended or adjusted under 35 U.S.C. 154(b) by 927 days.

(21) Appl. No.: 17/882,956

(22) Filed: Aug. 8, 2022

(65) Prior Publication Data

US 2023/0050748 A1 Feb. 16, 2023

Related U.S. Application Data

(60) Provisional application No. 63/231,503, filed on Aug. 10, 2021.

(51) Int. Cl.
*B81B 3/00* (2006.01)

(52) U.S. Cl.
CPC .... *B81B 3/0021* (2013.01); *B81B 2201/0264* (2013.01); *B81B 2203/0109* (2013.01); *B81B 2203/0127* (2013.01); *B81B 2203/0163* (2013.01); *B81B 2203/0307* (2013.01); *B81B 2203/0315* (2013.01); *B81B 2203/0353* (2013.01); *B81B 2203/04* (2013.01); *B81B 2207/056* (2013.01); *B81B 2207/11* (2013.01)

(58) Field of Classification Search
CPC .......... B81B 3/0021; B81B 2201/0264; B81B 2203/0109; B81B 2203/0127; B81B 2203/0163; B81B 2203/0307; B81B 2203/0315; B81B 2203/0353; B81B 2203/04; B81B 2207/056; B81B 2207/11; G01L 9/0044; G01L 9/0072; B81C 1/00182; B81C 2203/0714
See application file for complete search history.

(56) References Cited

U.S. PATENT DOCUMENTS

| | | | |
|---|---|---|---|
| 7,446,300 | B2 | 11/2008 | Silvestre |
| 7,663,538 | B2 | 2/2010 | Silvestre |
| 7,782,026 | B2 | 8/2010 | Silvestre |

(Continued)

FOREIGN PATENT DOCUMENTS

| | | |
|---|---|---|
| CN | 205337599 U | 6/2016 |
| CN | 110037350 A | 7/2019 |

(Continued)

OTHER PUBLICATIONS

Fernandez et al., "Experiments on the Release of CMOS-Micromachined Metal Layers", Journal of Sensors, vol. 2010, Article ID 937301, 7 pages, DOI: 10.1155/2010/937301 (2010).

(Continued)

*Primary Examiner* — Steven B Gauthier
*Assistant Examiner* — Khatib A Rahman

(57) ABSTRACT

A MEMS pressure sensor is provided having a membrane made with one of plurality of metal layers. A lid is positioned above the membrane and connected to a plurality of cavity walls at distal ends of the membrane. The lid includes an array of holes positioned on a region of the lid. A fixed metal electrode is positioned below the lid.

15 Claims, 19 Drawing Sheets

(56) References Cited

U.S. PATENT DOCUMENTS

| | | | | |
|---|---|---|---|---|
| 7,876,182 | B2 | 1/2011 | Silvestre | |
| 9,685,295 | B2 | 6/2017 | King et al. | |
| 11,312,617 | B2 | 4/2022 | Silvestre | |
| 2007/0157465 | A1 | 7/2007 | Silverbrook et al. | |
| 2009/0153258 | A1* | 6/2009 | Lutz | H03H 9/2447 331/156 |
| 2009/0278217 | A1* | 11/2009 | Laming | B81C 99/004 257/419 |
| 2010/0295138 | A1* | 11/2010 | Montanya Silvestre | H01L 24/05 257/415 |
| 2012/0090393 | A1 | 4/2012 | Silvestre et al. | |
| 2013/0081930 | A1 | 4/2013 | Shimoda et al. | |
| 2014/0225250 | A1* | 8/2014 | Montanya Silvestre | B81C 1/00246 257/734 |
| 2015/0329353 | A1* | 11/2015 | Cheng | B81C 1/0023 438/51 |
| 2016/0119722 | A1* | 4/2016 | Chu | H04R 31/006 438/51 |
| 2016/0128389 | A1* | 5/2016 | Lamb | A24F 40/51 131/328 |
| 2016/0358841 | A1* | 12/2016 | Eid | H05K 1/181 |
| 2020/0369515 | A1* | 11/2020 | Tseng | B81B 7/02 |
| 2021/0134602 | A1* | 5/2021 | Arshad | H01L 21/30625 |
| 2021/0206624 | A1* | 7/2021 | Silvestre | B81B 3/0021 |
| 2021/0221674 | A1* | 7/2021 | Silvestre | B81B 3/0021 |
| 2023/0200451 | A1 | 6/2023 | Silvestre et al. | |

FOREIGN PATENT DOCUMENTS

| | | | |
|---|---|---|---|
| CN | 112674390 | A | 4/2021 |
| CN | 113184797 | A | 7/2021 |
| KR | 20200129681 | | 11/2020 |
| TW | 201542442 | A | 11/2005 |
| TW | 201319604 | A | 5/2014 |
| WO | 2020009457 | A1 | 1/2020 |

OTHER PUBLICATIONS

Jang et al., "MEMS capacitive pressure sensor monolithically integrated with CMOS readout circuit by using post CMOS processing," Micro and Nano Systems Letters, vol. 5, No. 1, pp. 1-5, DOI: 10.1186/S40486-016-0037-3 (Jan. 9, 2017).

Michalik et al., "CMOS BEOL-embedded lateral accelerometer," 2015 IEEE Sensors, Busan, Korea (South), pp. 1-4, DOI: 10.1109/ICSENS.2015.7370516 (2015).

Michalik et al., "CMOS BEOL-embedded z-axis accelerometer," Electronics Letters, vol. 51, iss. 11, pp. 865-867 (May 2015).

Michalik et al., "Experiments on MEMS Integration in 0.25 μm CMOS Process," Sensors, vol. 18, No. 7, 22 pgs., DOI: 10.3390/s18072111, www.mdpi.com/journal/sensors (2018).

Silvestre, J., "Ultra-low Cost MEMS Devices in Standard CMOS," SEMICON Europa, 20 pgs. (Oct. 9-11, 2012).

Tsai et al., "The CMOS-MEMS 3-Axis Capacitive Accelerometer to Meet the Commercial Specifications," 2016 IEEE 29th International Conference on Micro Electro Mechanical Systems (MEMS), Shanghai, China, pp. 1002-1005, DOI: 10.1109/MEMSYS.2016.7421802 (2016).

Tseng et al., Implementation of a monolithic capacitive accelerometer in a wafer-level 0.18 μm CMOS MEMS process, J. Micromech. Microeng., vol. 22, No. 5, pp. 1-13, DOI: 10.1088/0960-1317/22/5/055010 (Apr. 2012).

Valle et al., "Experimental Analysis of Vapor HF Etch Rate and Its Wafer Level Uniformity on a CMOS-MEMS Process," Journal of Microelectromechanical Systems, vol. 25, No. 2, pp. 401-412, DOI: 10.1109/JMEMS.2016.2533267 (Apr. 2016).

Valle et al., "Manufacturing issues of BEOL CMOS-MEMS Devices," IEEE Access, vol. 9, pp. 83149-83162, DOI: 10.1109/ACCESS.2021.3086867 (Jun. 7, 2021).

International Search Report and Written Opinion in Application No. PCT/EP2023/078717 dated Feb. 12, 2024, 10 pages.

International Search Report and Written Opinion in Application No. PCT/EP2022/072381 dated Feb. 27, 2023, 18 pages.

International Preliminary Report on Patentability in Application No. PCT/EP2022/072381 dated Feb. 13, 2024, 13 pages.

* cited by examiner

MEMS PRESSURE SENSOR BUILT USING THE BEOL METAL LAYERS OF A SOLID-STATE SEMICONDUCTOR PROCESS

RELATED APPLICATIONS

This application claims priority to U.S. provisional application No. 63/231,503 filed on Aug. 10, 2021, the contents of which is included herein in its entirety.

BACKGROUND

An integrated circuit is a semiconductor device that has a substrate of a semiconductor material on which a series of layers are deposited using photolithographic techniques. The layers are doped and polarized so that electrical elements (e.g., resistances, capacitors, or impedances) or electronic elements (e.g., diodes or transistors) are produced. Subsequently other layers are deposited, which form the structure of interconnection layers necessary for electrical connections.

Micro-electro-mechanisms or micro-electro-mechanical systems (MEMS) are small electro-mechanical devices made using layer deposition technologies based on photolithographic techniques. MEMS may provide cavities or hollow spaces in the inside thereof, which may be filled with liquids or gases. Conventional integrated circuits are completely solid devices, i.e., without any kind of hollows. Hollows may be defined as cavities that are larger than hollows on the atomic or subatomic scale. MEMS may have mobile elements inside them. The mobile elements may be joined by one of the ends thereof to the rest of the MEMS structure, or may be completely loose (i.e., not physically attached to its surroundings) inside a housing that is at least partially closed (to prevent the loose part from "escaping" from the MEMS). A chip may include a MEMS device and an integrated circuit (IC), where the IC may control the MEMS.

One application of MEMS is in pressure sensors. In order to build a pressure sensor, in principle, it is enough to have a membrane, where on one side there is a fixed pressure, and on the other it samples the air or gas with the pressure that needs to be measured. Then this membrane is bent or deformed due to the pressure difference on both sides and, if there is a fixed electrode that does not move on one side, then the electrical capacitance between the fixed electrode and the moveable one changes and, by measuring this capacitance variation, one can know the pressure variation.

While existing designs to build a pressure sensor can be simply implemented, such state of the art pressure sensors developed using CMOS processing have numerous substantial drawbacks that largely limits sensor performance, reliability and yield, to the point of being of little use.

Another issue with existing pressure sensors developed using CMOS processing is that, if the sealing is made by adding new material, like aluminum sputtering, a PI deposition, or other material, such an implementation will be increasing considerably the thickness of the membrane, thereby drastically reducing the sensor's sensitivity.

Still another problem is that the reference pressure will be the one being inside this chamber that is created under the membrane once the membrane is sealed. This is a problem because CMOS, like most if not all semiconductor processes, are known to have outgassing. This means that there will be gas molecules that will enter into the reference cavity and, ultimately, the cavity will not be completely scaled. So, depending on the pressure difference between the cavity and the external air, there can be a slight change in pressure over time. So the reference pressure inside the cavity will drift with time, and this effect is accelerated with temperature.

Furthermore, another potential issue is that the membrane will be completely exposed. The sensor device will not be resistance to harsh conditions including dust and water, among others. Any dust, water or other contamination, can fall onto the membrane, producing a change or drift of its sensitivity, and eventually permanently damaging the device. The reliability is inadequate depending on the application. It can be a problem in applications like e-cigarette or tire pressure monitoring system (TPMS), where there is a dirty atmosphere. Also, as with existing capacitive type sensors, it is desirable to simplify the sensing mechanism to reduce cost and improve reliability.

SUMMARY

According to one aspect of the subject matter described in this disclosure, a MEMS pressure sensor is provided. The MEMS sensor incudes a membrane made with one of plurality of metal layers. A lid is positioned above the membrane and connected to a plurality of cavity walls at distal ends of the membrane. The lid includes an array of holes positioned on a region of the lid. A fixed metal electrode is positioned below the lid.

According to another aspect of the subject matter described in this disclosure, a MEMS pressure sensor is provided. The MEMS pressure sensor include a membrane made from one of a plurality of metal layers. The membrane includes a plurality of holes. An electrode, positioned below the membrane, made from a different metal layer of the plurality of metal layers having the same shape as the membrane or at least extending across the area where the plurality of holes of the membrane are positioned.

According to another aspect of the subject matter described in this disclosure, a MEMS pressure sensor is provided. The MEMS pressure sensor includes a metal layer made from one of a plurality of metal layers. A pedestal, positioned below the metal layer, is made from a set of different metal layers of the plurality of metal layers, The pedestal reduces a capacitance gap at the center of the metal layer.

According to another aspect of the subject matter described in this disclosure, a MEMS pressure sensor is provided. The MEMS pressure sensor includes a metal layer made from one of a plurality of metal layers. A pedestal, positioned below the metal layer, is made from a set of different metal layers of the plurality of metal layers. The set of different metal layers includes a plurality of wing-shaped electrodes.

According to another aspect of the subject matter described in this disclosure, a MEMS pressure sensor is provided. A MEMS pressure sensor includes a metal layer made from one of a plurality of metal layers. A piston, positioned below the metal layer, made from a set of different metal layers of the plurality of metal layers. The piston captures displacement of the metal layer when pressure is applied to the metal layer.

According to another aspect of the subject matter described in this disclosure, a MEMS pressure sensor is provided. A MEMS pressure sensor includes a metal layer made from one of a plurality of metal layers. A pedestal, positioned below the metal layer, is made from a set of different metal layers of the plurality of metal layers. The metal layer includes a membrane integrally connected to a wing-shaped portion of one of a plurality of winged-shaped metal layers.

Additional features and advantages of the present disclosure is described in, and will be apparent from, the detailed description of this disclosure.

BRIEF DESCRIPTION OF THE DRAWINGS

The disclosure is illustrated by way of example, and not by way of limitation, in the figures of the accompanying drawings in which like reference numerals are used to refer to similar elements. It is emphasized that various features may not be drawn to scale and the dimensions of various features may be arbitrarily increased or reduced for clarity of discussion.

DETAILED DESCRIPTION

Figure 1B:
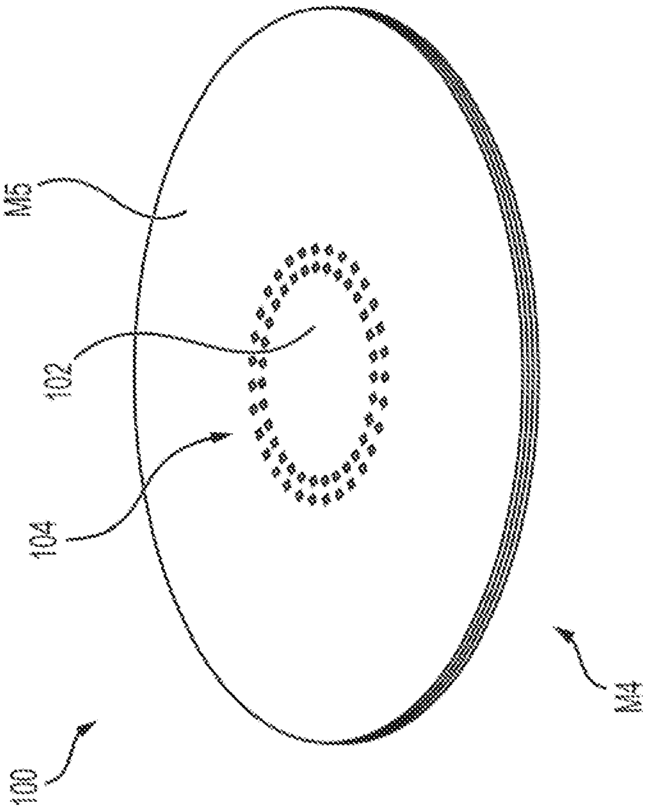
FIGS. 1A-1E are schematic diagrams of a process of forming a MEMS pressure sensor without showing the silicon dioxide, passivation, and substrate, in accordance with some embodiments.
Figure 1A:
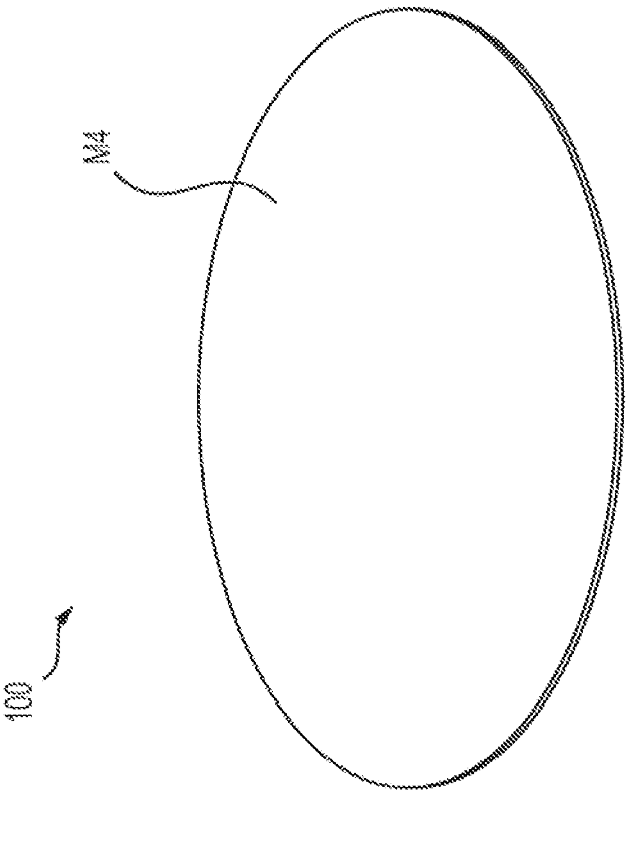

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may recognize that other elements and/or operations may be desirable and/or necessary to implement the devices, systems, and methods described herein. But because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

The terminology used herein is for the purpose of describing particular example embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer or section. That is, terms such as "first," "second," and other numerical terms, when used herein, do not imply a sequence or order unless clearly indicated by the context.

Aspects of the present disclosure are directed to a MEMS pressure sensor and forming thereof. The pressure sensor includes a lid, a membrane, and a fixed electrode. In addition, the sensor may include a vertical wall at the edges of the lid and a membrane that may have the same shape so that they can be joined to close a cavity. This cavity may contain the reference pressure. The top metal layer of the sensor may be the top metal layer of the process, or it could be at any other layer. In some embodiments, it may have two arrays of holes.

The pressure sensor includes one inner array of holes across the lid in order to etch the silicon dioxide inside the cavity made with the lid, the membrane, and the surrounding walls. Also, an outer array of holes to etch the volume around this cavity. In this way, the membrane can be made with a metal layer that may not be the top metal layer of the process. In some embodiments, one may not seal the metal layer because it does not have holes.

The pressure sensors are built using the backend-of-the-line (BEOL) metal layers of a solid-state semiconductor process.

Different solutions have been proposed for this using, for example, combinations of plasma and/or wet etching with HF and other chemicals. These process are difficult to take into volume production with a high yield, especially when involving wet etching.

The simple post-processing approach that has been previously proposed consists in using a single vapour HF (vHF) mask-less post-processing step. The vHF etches away the silicon oxide existing in between the metal layers of the BEOL and it leaves all the metals. This was proposed by Baolab. Because of its simplicity it is the lowest cost CMOS post-processing approach. Furthermore, it can be implemented in the same CMOS foundry or in the packaging or assembly house.

In this approach, the MEMS device is built using the metal layers, typically Al or AlCu and W, but there could be also others like Cu. It is possible to trap oxide inside metal casing with the right designs. Other materials may be used, but they must exist in the CMOS BEOL. Most of the previous approaches use a special package, such as a laminate one, e.g., LGA, in order to protect the MEMS. This increases the cost and the size, thus minimizing or eliminating the size and cost advantages, that we would otherwise get building the MEMS using the CMOS process.

Baolab proposed to use the top most metal layer to protect the MEMS, while having small holes that would allow the vHF to go inside the MEMS cavity. Later a second set of post-processing steps consisting in Al sputtering and patterning would be applied, to seal properly the MEMS device. This is typically a 10% cost adder to the CMOS process. This simplifies the packaging requirements, and it is no longer needed to use a laminate or other special packaging. Instead any standard packaging technique, like QFN or another, could be used. This reduces cost and size of the final IC.

In addition to the top metal layer, the bottom metal layer was used to complete a metal cavity where the MEMS device is located. This was done to limit the etching of vHF towards the bottom, given that most CMOS processes do have a doped silicon oxide below M1, which is the bottom most metal layer. Doped silicon oxide reacts very aggressively to vHF, increasing quickly the etching speed, and leaving very nasty residues that would be difficult to eliminate. This makes the designs portable to most CMOS processes, as otherwise it would only be applicable to special ones not having doped silicon oxide under the bottom most metal layer of the BEOL.

Baolab's solution, like the other solutions using the materials in the BEOL to implement the MEMS devices, surrounds the MEMS device with metallic walls, which define the MEMS cavity within the ASIC die. This way the electronics is placed around it. The implementation of these metallic walls is made with a stack-up of metal layers (usually made with aluminum) and vias (usually tungsten). However the materials could be different, mainly copper, if we go to lower CMOS nodes, below 0.18 um processes. In principle, this is not a straight vertical wall, as DRC rules require metal layers to extend beyond the edges of the vias. However it is possible to make some exceptions to this, if we are interested in increasing the lateral area exposed on the wall, for instance in case of an in-plane capacitive sensor. This would then be a DRV that the foundry would have to accept.

Using Baolab's solution, vertical metallic walls in principle connect the top and bottom metal planes, thus shorting electrically all the MEMS cavity. Usually we will not be interested in this, or at least not happening everywhere in all the cavity. In order to solve this issue, Baolab used vertical interleaved anchor structures. These structures force the vHF to go up and down across the silicon oxide layers, until it is exhausted, thus leaving some unetched silicon oxide. This way we get a mechanical consistent wall, without electrically shorting the top and bottom metal plates.

One reason this is particularly effective is that usually the silicon oxide layers deposited between the metal layers of the BEOL of a CMOS process consist on two different sublayers each, having different oxide densities. Therefore, one of these layers etches away with vHF slower than the other. This way, etching the silicon oxide with vHF in the vertical direction is more difficult (i.e., it takes more time) than etching horizontally, as then the etching propagates faster along one of the silicon oxide sublayers. With these anchor structures we force the vHF to etch across all the slow etching rate sublayers, without being able to propagate quickly through the fast ones. These interleaved anchors can be used also to add columns or pillars at different locations of the MEMS, in order to provide more consistency to the top metal plane. This is particularly important in views of supporting the later sealing with Al sputtering typically, so that the top metal plane is not bended, which would end up destroying or leaving unusable the MEMS device.

The main problem with these anchor walls is that, although they provide mechanical robustness while leaving the top and bottom metal planes electrically disconnected, the electrical capacitance between them is very large. This is because of the large surface that is placed close to each other inside the interleaved anchor structure, one connected to the top and the other to the bottom plates, and even worse having an important fraction of this filled with silicon oxide.

Another problem related to the previous one is that there is a critical trade-off between this parasitic capacitance between top and bottom metal plates, versus production yield and reliability. In order to minimize this parasitic capacitance we can both minimize the length of the anchor structure, reducing the number of fingers and/or their heights, and/or we can increase the etching time. This way, if we want to minimize this parasitic capacitance, we will have small anchor structures with minimal quantity of silicon oxide remaining inside them after the vHF etching. However this will be a very weak structure, prone to easy mechanical failure due to mechanical shock, vibration, or simply when sealing or packaging the device. Also it will leave to low yield. Because a slightly overetch will remove completely the silicon oxide inside the anchor structure, producing a collapse of the top and bottom parts and leaving the device completely unusable. In production we need to avoid this requirement for a critical vHF etching, because it will always lead to a low yield. The reason is that the etching speed and the silicon oxide etched inside the MEMS cavity, does depend both on the vHF machine and recipe applied, but also on the CMOS processing. While we can have a tight control on the vHF machine and its recipe, we cannot control the CMOS process, which typically has tolerances in the order of 30%.

In addition to potentially requiring all the metal layers to implement the MEMS devices, thus needing special packaging processes, requiring specific CMOS processes without doped silicon oxide under the bottom most metal plate, and the large parasitic capacitances, two major problems with all the solutions using the materials in the CMOS BEOL to implement the MEMS, are yield and reliability. These problems are more critical when we use the Baolab approach, with top and bottom metal planes. However, if we don't use them, then the process becomes more complex and expensive, thus losing the cost advantage, and also the volume production, time to market and even the performance advantages.

One major problem found when using the BEOL metals of a CMOS process to implement MEMS devices, is the vertical stress gradient. This is something that is minimized in bespoke MEMS manufacturing processes. However, in a CMOS, since these metal lines where not intended to implement mechanical structures but just electrical connections, being surrounded by silicon oxide, in a solid state IC, residual stresses are less of a concern, resulting typically in large values. In addition to large residual stress, we typically find a large vertical stress gradient. This results in the metals bending or curling, typically upwards, but depending on the layers it can be downwards, especially on the top one. This bending is a big concern when we use top and bottom metal planes. Because then the vertical gap spacing available above and below the device is minimal, and it can easily touch them. When the MEMS device touches the top or bottom metal planes, it becomes unusable. This leads to very poor yield and reliability.

One possibility to reduce a hit this problem would be to increase this vertical gap distance, reducing the number of metal layers used for the MEMS device itself. However this would reduce performance in the out-of-plane direction, as the gap would be larger, and so the relative capacitance variation for a given sensor for the same displacement would be reduced. Also in the case of an inertial sensor, we would be forced to a smaller proof mass, not being able to use all the available metal layers, reducing even more the performance. And reducing the number of metal layers used to build the moveable part of the device, like the proof mass in the case of an inertial sensor, will increase even more its curvature, as explained later There is a need therefore to minimize the curvature height of the MEMS device. This is defined as the maximum vertical displacement, so in the out-of-plane direction, of any metal layer along all the MEMS device or a particular element of it.

One known solution to this problem is to stack-up two or more metal layers. This way we increase the radius of curvature of the resulting metal structure, thus reducing the total curvature height. However, and while this is a good solution to design some parts of MEMS devices, like the proof mass of a inertial sensor, which we want to make as large as possible to improve the sensitivity of the sensor, for other parts like the springs, it leads to very large stiffness, thus reducing largely the sensitivity. Actually stiffness is inversely proportional to the third power of the length versus thickness, so increasing the thickness it leads very quickly to very stiff springs. This means very low sensitivity for sensors, and large driving voltages for actuators. Furthermore, the stack-up of many layers is limited by the number of metal layers in the process, and if there is a need to modify or use a CMOS process with a larger number of metal layers in the BEOL, this will increase quickly its cost.

As a summary, there is a need to find the right designs to implement MEMS devices by reusing the BEOL materials existing in a standard CMOS process, using vHF to etch away part of the silicon oxide within the MEMS cavity, which can be packaged with WLCSP afterwards, and with these devices having a very high yield, reliability and performance.

Still another problem with using a vHF etching post process step after the CMOS, is that the SiN passivation layer deposited and patterned on the top of the CMOS wafer, it is partially etched away by vHF. This means that in practice, unless a very short vHF etching step is performed, the SiN passivation layer will be largely or totally etched away. This will leave nasty residues in the wafer and it will expose all the wafer with the ASIC area that should not have its silicon oxide etched away.

A known solution to prevent this is to increase the silicon content of the passivation, typically measured by the Refractive Index or RI of the layer. Although technically it is not something complex to be done, this requires a process tweak, and for large mainstream foundries it is very challenging that they accept it. Ultimately this requirement means that we will no longer be able to use a completely standard CMOS process, and hence we will be losing to some extent the advantages of low cost, short time to market and high volume production capability.

In various aspects, the systems, devices, and methods disclosed herein result from or use vHF etching to etch away part of the silicon oxide in the BEOL of a CMOS process, thus releasing material existing in the BEOL that will constitute the MEMS device, such as described in U.S. Pat. No. 11,312,617, the entire contents of which are incorporated herein by reference.

Some aspects may include a method for manufacturing a MEMS device using the materials of the BEOL of a CMOS process including: applying a post-processing of vHF and post backing to form the MEMS device to form: a membrane made with one of plurality of metal layers; a lid positioned above the membrane and connected to a plurality of cavity walls at distal ends of the membrane, wherein the lid includes an array of holes positioned on a region of the lid; and a fixed metal electrode positioned below the lid. Some aspects may include a method for manufacturing a MEMS device using the materials of the BEOL of a CMOS process including: applying a post-processing of vHF and post backing to form the MEMS device to form: a membrane made from one of a plurality of metal layers, wherein the membrane includes a plurality of holes; and an electrode, positioned below the membrane, made from a different metal layer of the plurality of metal layers having the same shape as the membrane or at least extending across the area where the plurality of holes of the membrane are positioned.

All of the inventive concepts described throughout the present application, although in principle applying to CMOS, may also be applicable to the BEOL of any other solid state semiconductor process, like BiCMOS, GaAs, SiGe, GaN, SOI, and so on.

FIGS. 1A-1E are schematic diagrams of a process of forming a MEMS pressure sensor 100 without showing the silicon dioxide, passivation, and substrate, in accordance with some embodiments. The pressure sensor 100 is built using the four top-most metal layers of the back-end of a CMOS process. In particular, a 0.18 μm node is used, which has a total of 6 metal layers. This means that the lowest two metal layers (M1 and M2) are not used. Hence, one can use metal layers M1 and M2 to implement the application-specific integrated circuit (ASIC) underneath. The pressure sensor 100 includes a circular metal layer M4, shown in FIG. 1A. The metal layer M4 is configured to operate as a lower metal plane and electrode. As shown in FIG. 1B, a circular metal layer M5 is positioned on metal layer M4. The metal layer M5 includes membrane 102 placed in its middle region. Moreover, the metal layer M5 has several holes forming an outer array of holes 104 around the periphery of membrane 102.

Figure 1D:
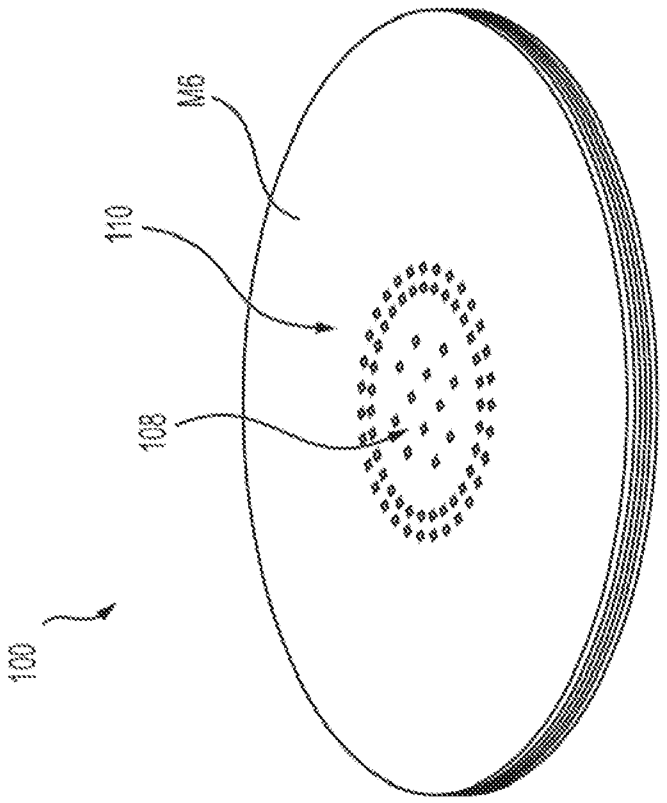
Figure 1C:
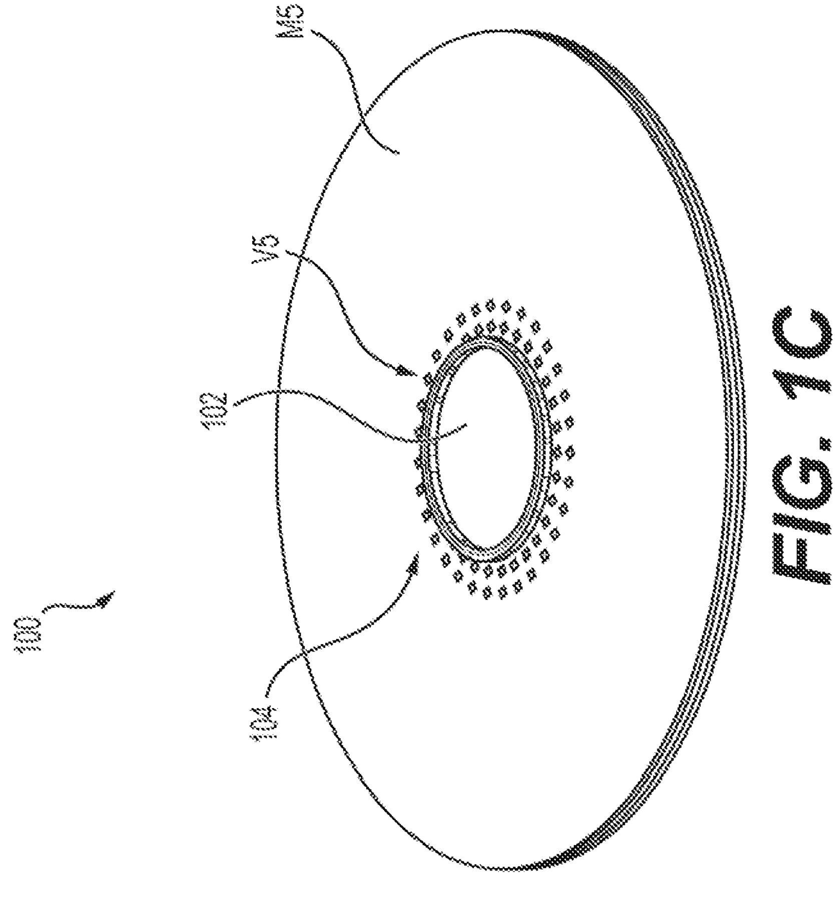
Figure 1E:
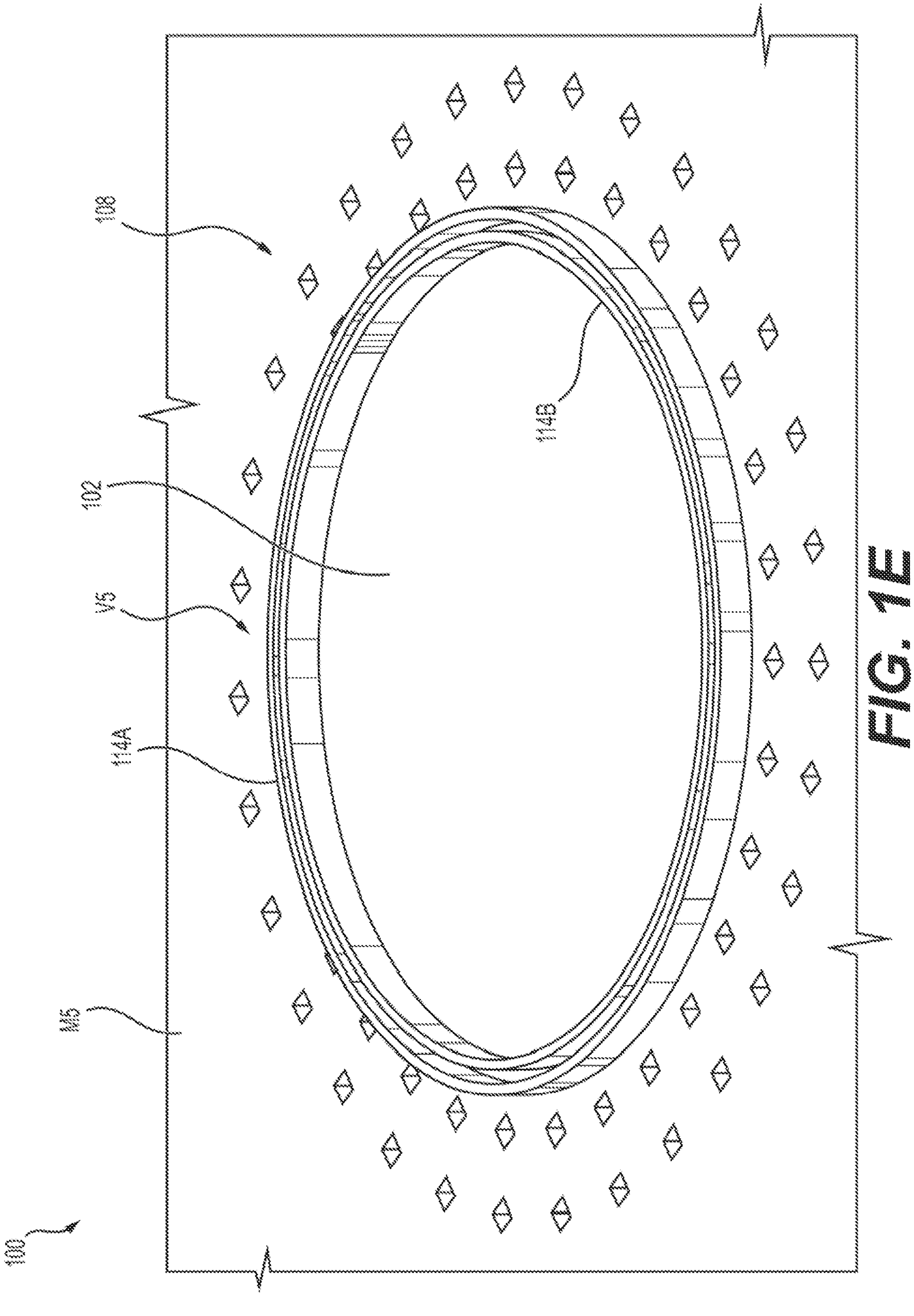

A via structure 106 is placed around the periphery of membrane 102, as shown in FIG. 1C. The via structure V5 includes a double wall structure made with two via rings 114A and 114B to define an internal cavity in pressure sensor 100 and fix the edges of membrane 102, as shown in FIG. 1E. Moreover, the via structure V5 may use to trap oxide inside for pressure measurements. A circular metal layer M6 is positioned on metal layer M5 and operates as a lid for pressure sensor 100, as shown in FIG. 1D. The metal layer M6 includes an inner array of holes 108 and an outer array of holes 110. The holes of inner array of holes 108 are positioned to provide access to membrane 102. Also, the holes of the outer array of holes 104 and 110 are aligned to provide access to metal layer M4. In some embodiments, the holes of the inner array of holes have at least a distance of 20 μm from each hole.

In some embodiments, metal layers M4, M5, and M6 have a shape that is not circular. Metal layers M4, M5, and M6 are built using the BEOL metal layers of a solid-state semiconductor process.

The pressure sensor 100 is built using the four top-most metal layers of the back-end of a CMOS process. In particular, a 0.18 μm node is used, which has a total of 6 metal layers. This means that the lowest two metal layers (M1 and M2) are not used and may be used to implement the ASIC circuit underneath. The lowest metal layer is M4 has a diameter of 100 μm. This is the lower fixed electrode of the capacitance. Above metal layer M4, metal layer M5 is of the same size. The holes of outer array of holes 110 are sized at 0.8 μm and located in an annular area from a radius of 14 μm to 18.5 μm of metal layer M5.

The purpose of these holes is to allow a vapour flouridric acid (vHF) etching process, during the post-processing of the wafer, to go all the way under membrane 102, having a diameter of 25 μm. All the oxide between metal layers M5 and M4 over membrane 102 is completely etched away. That is why the holes need to be located outside membrane 102. Also, it is preferred that the holes not extend too far away, as this would increase the etching around membrane 102, which would result in a reduced mechanical consistency.

The metal layer M6 has the same shape as metal layer M5. The holes of inner array of holes 108 are positioned in a circular region on metal layer M6 having a 25 μm diameter. This is to etch all the silicon oxide above membrane 102. The via structure V5 is the via layer between metal layers M5 and M6. The via rings 114A and 114B may have the standard width as via structure V5, typically 0.36 μm. In this case, via rings 114A and 114B are configured to trap oxide inside, which builds a more robust composite wall made of oxide+tungsten in the horizontal direction. This wall is located outside membrane 102 but inside the outer array of holes 104 of metal layer M5.

In some embodiments, a single via ring is used to form the wall. In some embodiments, multiple via rings are used to form the wall. This may apply to some applications where a very large range of temperature is required. In such a situation, metal-only walls may be used, requiring only one via ring, because of the thermal coefficient mismatch between aluminum, tungsten, and silicon oxide.

The membrane 102 is entirely free of silicon oxide both above and below, and it may be fixed at its edges by the wall made using via structure V5 and silicon dioxide. The remaining portions of metal layer M5 outside membrane 102 do not behave as a membrane. This is because of two reasons: 1.) There is no pressure difference between the above and below surfaces; and 2.) A large part of the remaining portions of metal layer M5 is buried in silicon dioxide. Therefore, the distal parts of metal layer M5 are firmly attached to the surrounding silicon dioxide of the BEOL, and hence it tightly supports membrane 102. Note the vHF post-processing is exhausted before it gets to the edges of metal layer M5.

The electrical connection to the ASIC to sense the capacitance is made at any point between metal layer M5 or M6, and metal layer M4. In some embodiments, capacitance detection is done using a conventional transconductance amplifier circuit. In some embodiments, the capacitance detection is done using a MEMS to implement an RC circuit that is periodically charged. The output is sent to a comparator to count the time it takes to charge the capacitor to a specific value. In some embodiments, the detection of the capacitance is accomplished using the MEMS capacitance to implement a ring oscillator that generates a frequency that may depend on the capacitance of the MEMS pressures sensor, which can then be used to drive a counter, and after a fixed period it may give a number of counts that may depend on the capacitance value of the pressure sensor. In some embodiments, capacitance detection is done using any other circuit that can be used to measure capacitance.

Figure 2:
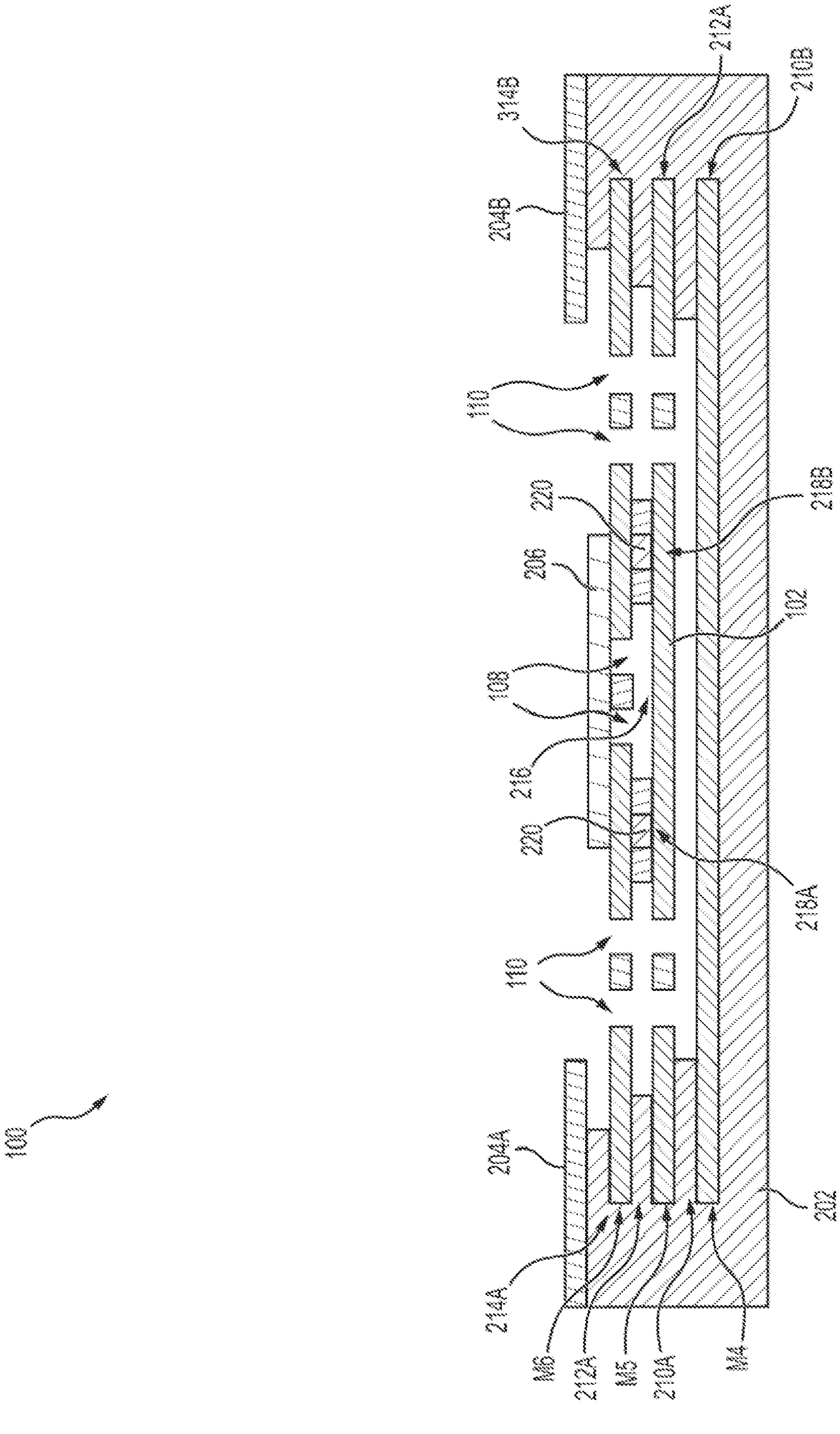
FIG. 2 is a schematic diagram of a cross-sectional view of the MEMS pressure sensor of FIGS. 1A-1D, in accordance with some embodiments.

FIG. 2 is a schematic diagram of a cross-sectional view of MEMS pressure sensor 100, in accordance with some embodiments. In particular, FIG. 2 shows the silicon dioxide layer 202, which is processed using the vHF etching process. Moreover, passivation layers 204A and 204B associated with the CMOS processing of pressure sensor 100 are positioned on silicon dioxide layer 202 to protect and shield silicon dioxide layer 202 against corrosion. A seal 206 may be positioned over the inner array of holes 108.

One reason to use seal 206 is to protect membrane 102 from not being exposed at all. Any dirt or contamination should have to go through the outer array of holes 110, which is already difficult due to their small size, and then it would have to travel and reach the surface of metal layer M4. If inner array of holes 108 above membrane 102 was kept opened and sealed those around it, some dirt or contamination might pass through the top metal holes of inner array of holes 108. This would go directly to the above surface of membrane 102. Therefore, this approach of sealing the inner array of holes 108 and leaving those in the external area adds an extra level of protection. Another reason to use seal 206 is that it keeps the pressure reference in membrane 102, where all internal surfaces of membrane 102 may be made with metal (aluminum and tungsten). This prevents or makes it very difficult to have outgassing effects, which would cause a drift of this reference pressure over time.

In some embodiments, the seal 206 is formed using laser bleeding or a similar technique to locally melt metal so that the holes of inner array of holes 108 are sealed. In some embodiments, the seal 206 is formed using sealing. In some embodiments, the sealing may be deposited and patterned on the holes of inner array of holes 108 using standard semiconductor and lithographic techniques. In some embodiments, the seal 206 is formed using aluminum spattering. In some embodiments, the seal 206 is formed using standard PI sealing of a wafer level chip scale package (WLCSP) process or the like. In some embodiments, the seal 206 is formed using silicon nitride residue of the passivation layer 204 for scaling the holes of inner hole array 108. In some embodiments, the seal 206 is formed by depositing a bump, using the standard bumping techniques in WLCSP.

The end portions of metal layer M4 that extend and are anchored firmly within silicon dioxide layer 202 to form capacitive anchors 210A and 210B, and end portions of metal layer M5 that extend and are anchored firmly within silicon dioxide layer 202 to form capacitive anchors 212A and 212B. Capacitive anchors 214A and 214B are defined by the end portions of metal layer M4 that extend and are buried firmly within silicon dioxide layer 202. The capacitive anchors 210, 212, and 214 are configured to provide mechanical support for metal layers M4, M5, and M6 and provide the necessary capacitance needed to measure pressure at membrane 102.

The pressure sensor 100 includes cavity 216 for trapping gases to measure the pressure. Cavity 216 provides cavity walls 218A and 218B formed using via structure V5. The cavity walls 218A and 218B, in conjunction with seal 206, are configured to minimize outgassing and increase pressure measurement accuracy.

Figure 3:
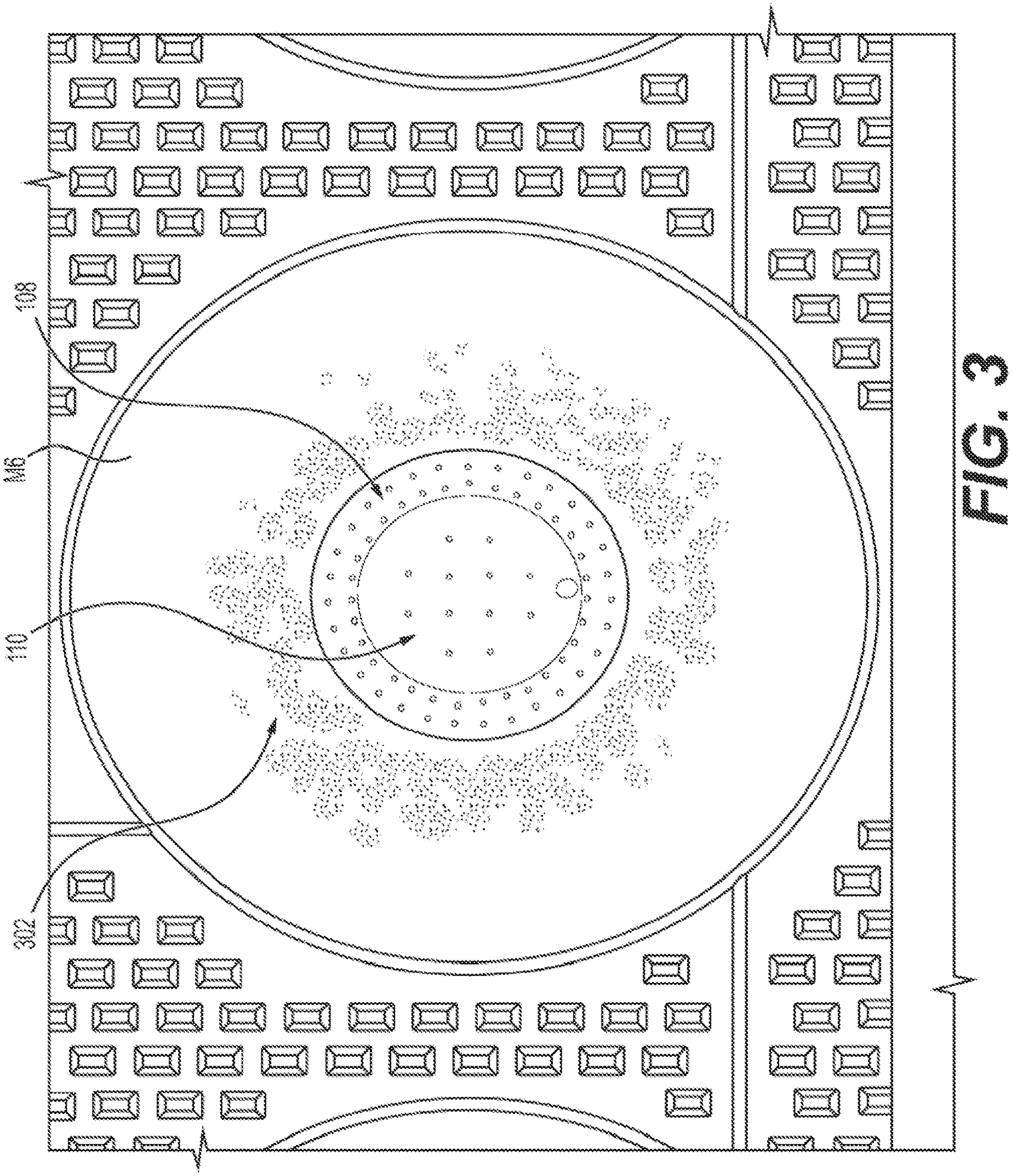
FIG. 3 is an SEM image of the MEMS pressure sensor of FIGS. 1A-1D, in accordance with some embodiments.

FIG. 3 is an SEM of MEMS pressure sensor 100, in accordance with some embodiments. In particular, FIG. 3 shows residues 302 coming from the etching of the SiN passivation layer. This is an unwanted effect due to the long etching time associated with the vHF etching process required to completely etch away all the oxide below the membrane 102, which cannot have holes. Residues 302 are even blocking the etching holes of the inner array of holes 108 and the outer array of holes 110. One way to address this issue is to use a less aggressive approach to the vHF etching process. The other is to adjust the etching times. Another option is to increase the passivation layer's silicon content, increasing the RI because this increases the resistance of the SiN being etched.

When applying voltages to the two electrodes (fixed electrode below through metal layer M4 and membrane through metal layers M5 or M6), the stiffness and the resonant frequency are calculated by measuring the capacitance variation with an impedance analyzer deriving the sensitivity to pressure (capacitance variation versus pressure variation). Surprisingly the membrane is relatively softer than expected. This softness may be due to the longer etching times, compared to other MEMS sensors like inertial sensors, required to etch the silicon dioxide under the long membrane, which does not have holes. The longer etching time must be etching away more of the ARC/TiN sublayers of the metal layers, thus reducing the overall stiffness of the membrane. This is preferable as it leads to more sensible pressure sensors, and it can be modulated using longer or shorter etching times with the vHF etching process. Although beyond a certain time, when all the ARC/TiN sublayer is gone, there should not be any further improvement in the softness and sensitivity of the pressure sensor.

Figure 4B:
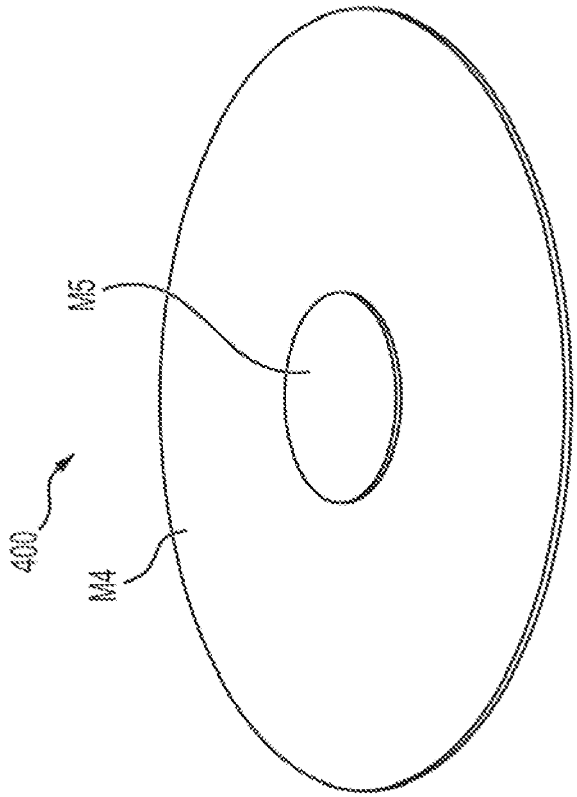
FIGS. 4A-4D are schematic diagrams of a process of forming a MEMS pressure sensor without showing the silicon dioxide, passivation, and substrate, in accordance with some embodiments.
Figure 4A:
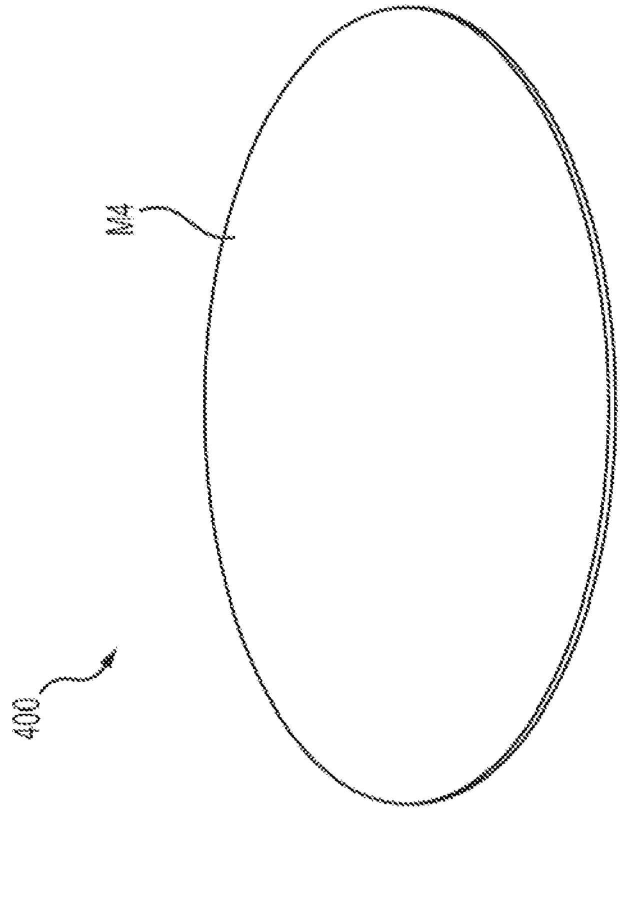
Figure 4D:
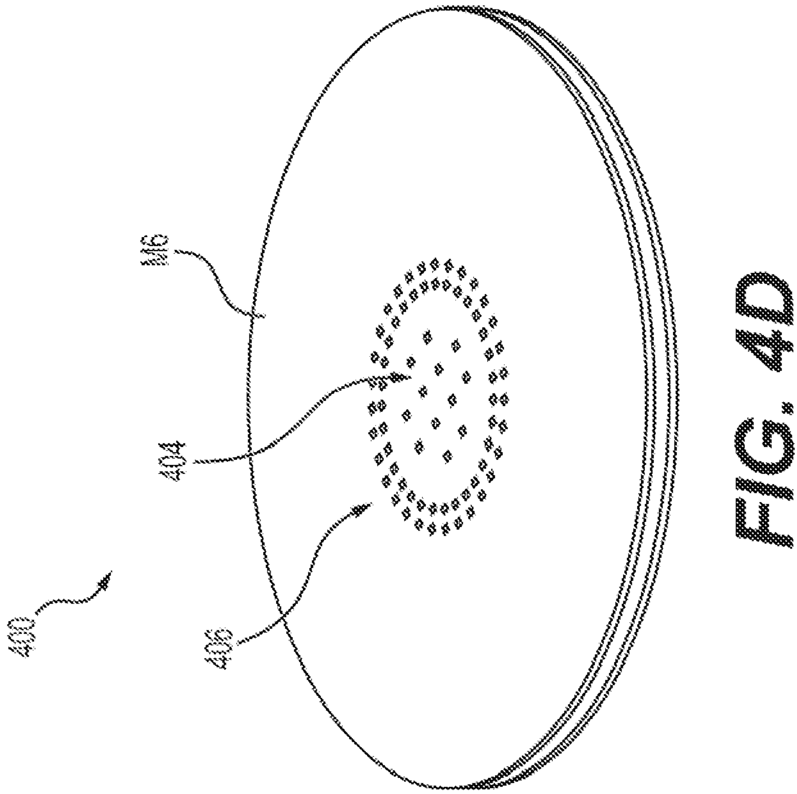
Figure 4C:
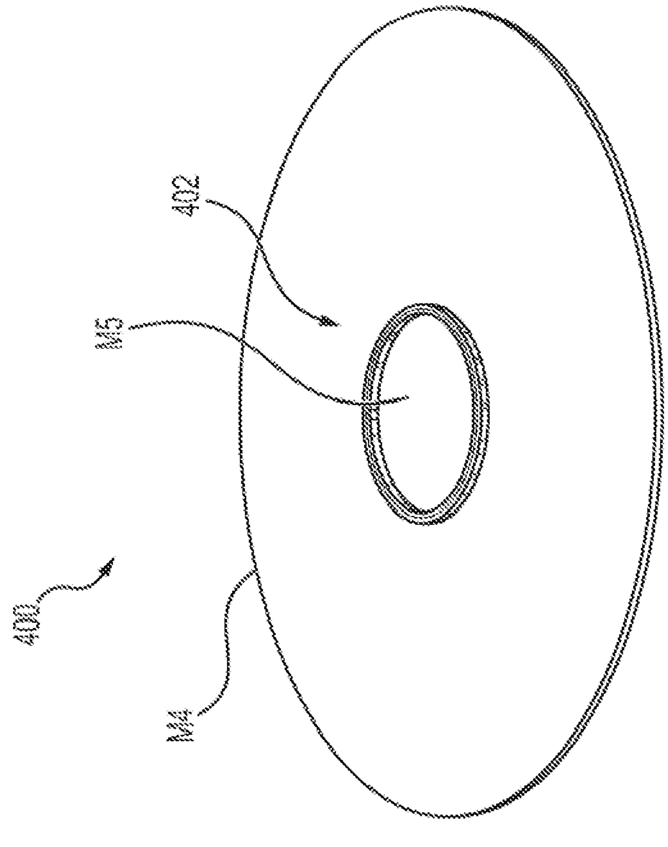

FIGS. 4A-4D are schematic diagrams of a process of forming a MEMS pressure sensor 400 without showing the silicon dioxide, passivation, and substrate, in accordance with some embodiments. The pressure sensor 400 includes a circular metal layer M4, shown in FIG. 4A. The metal layer M4 is configured to operate as a lower fixed electrode having a diameter of 100 μm. A circular metal layer M5 is placed above metal layer M4, as shown in FIG. 4B. The metal layer M5 is configured to operate as the membrane for pressure sensor 300. A double ring via 402 is positioned on metal layer M5, having a diameter of 25 μm, as shown in FIG. 4C. A circular metal layer M6 is positioned above the double ring via 402, as shown in FIG. 4D. In this case, the metal layer M6 is configured as a lid for pressure sensor 400. Also, the metal layer M6 includes an inner array of holes 404 and an outer array of holes 406.

In some embodiments, metal layers M4, M5, and M6 have a shape that is not circular. Metal layers M4, M5, and M6 are built using the BEOL metal layers of a solid-state semiconductor process.

The pressure sensor 400 is configured, so that membrane/metal layer M5 does not extend to the silicon dioxide layer. In this case, the metal layer M5 does include capacitive anchors. This is because the vertical walls of the cavity, built with a double ring via 406 at the edges of metal layer M5, are enough to fix the membrane M5 at its edges. This is discussed in further detail in FIG. 5.

In some embodiments, metal layer M6 is not used and is an optional feature.

Figure 5:
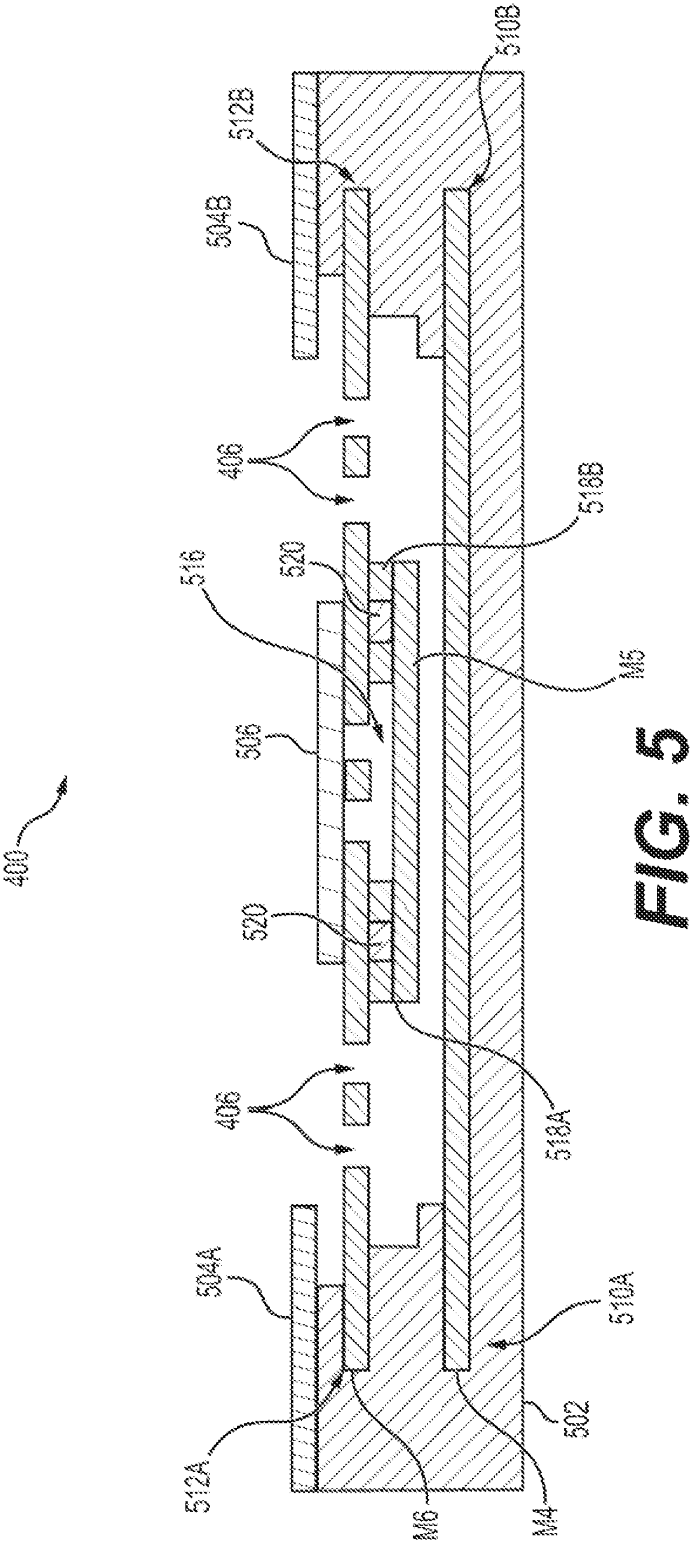
FIG. 5 is a schematic diagram of a cross-sectional view of the MEMS pressure sensor of FIGS. 4A-4D, in accordance with some embodiments.

FIG. 5 is a schematic diagram of a cross-sectional view of MEMS pressure sensor 400, in accordance with some embodiments. In particular, FIG. 5 shows the silicon dioxide layer 502, which is processed using the vHF etching process. Moreover, passivation layers 504A and 504B are positioned on silicon dioxide layer 502 to protect and shield silicon dioxide layer 502 against corrosion. A seal 506 may be positioned over the holes of the inner array of holes 108. Note seal 506 is formed using the same approaches described herein for seal 206.

The pressure sensor 400 includes cavity 516 for trapping gases to measure the pressure. Cavity 516 includes cavity walls 518A and 518B formed using double ring via V5. The cavity walls 518A and 518B, in conjunction with seal 506, are configured to minimize outgassing and increase pressure measurement accuracy. Moreover, each cavity wall 518A and 518B includes regions 520 filled with oxide from silicon dioxide layer 502 not etched by the vHF etching process.

The end portions of metal layer M4 extend and are anchored firmly within silicon dioxide layer 502 to form capacitive anchors 510A and 510B. End portions of metal layer M6 extend and are anchored firmly within silicon dioxide layer 502 to form capacitive anchors 512A and 512B. The capacitive anchors 510 and 512 are configured to provide mechanical support for metal layers M4 and M6 and provide the necessary capacitance to measure pressure at membrane metal layer M5. The edges of cavity walls 518A and 518B provide sufficient mechanical support to fix membrane/metal layer M5.

Figure 6:
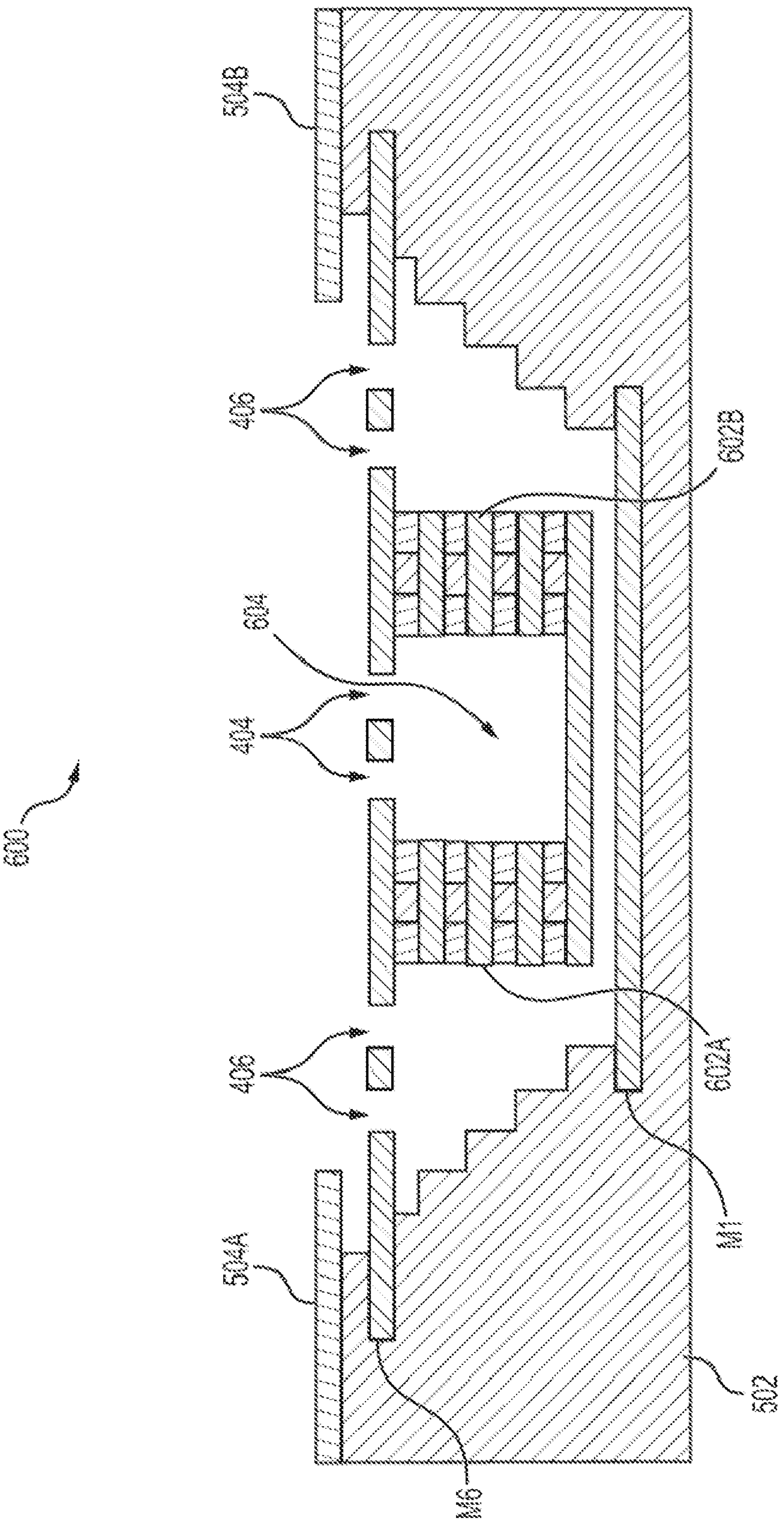
FIG. 6 is a schematic diagram of a cross-sectional view of a MEMS pressure sensor, in accordance with some embodiments.

FIG. 6 is a schematic diagram of a cross-sectional view of MEMS pressure sensor 600, in accordance with some embodiments. The pressure sensor 600 is similar to pressure sensor 400. The key difference is the addition of the larger cavity walls 602A and 602B producing a larger cavity 604 and the shorter length of metal layer M1 of pressure sensor 600. The larger cavity walls 602A and 602B may be formed using additional double-ring vias, such as double-ring via 406, stacked vertically. The pressure sensor 600 reduces parasitics between metal layer M1 with the extension of metal layer M6 by reducing the size of metal layer M1, which does not need to be the same size as metal layer M6. The shorter length for metal layer M1 and larger cavity walls 602 protects the IMD oxide under metal layer M1 because the vHF etching process is not required to reach metal layer M1 for processing. It is preferable to protect the IMD oxide under metal layer M1 from being reached by the vHF process because this oxide typically is doped, producing a terrible reaction and spoiling the wafer.

Figure 7:
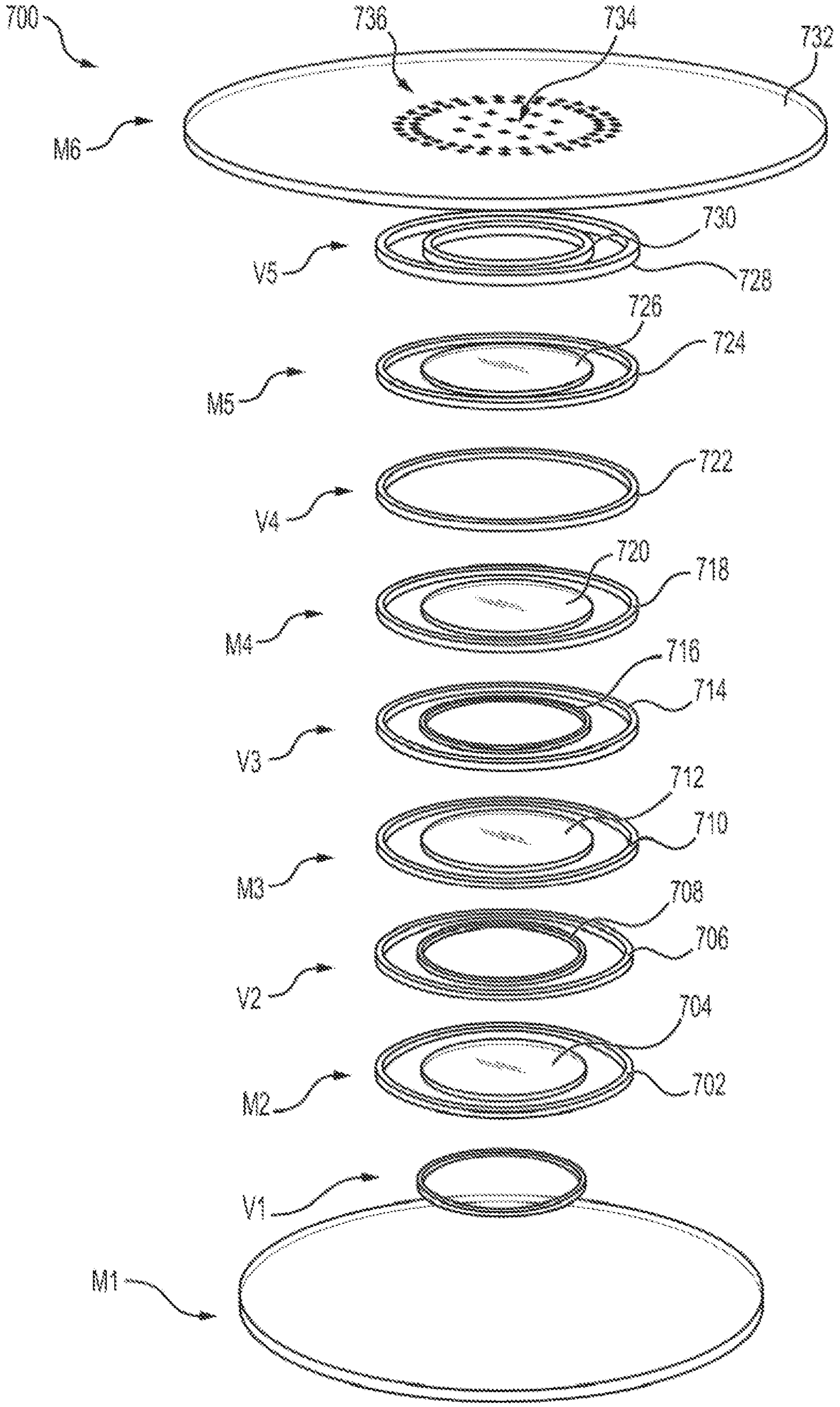
FIG. 7 is a schematic diagram of an exploded view of a MEMS pressure sensor without showing the silicon dioxide, passivation, and substrate, in accordance with some embodiments.

FIG. 7 is a schematic diagram of an exploded view of MEMS pressure sensor 700 without showing the silicon dioxide, passivation, and substrate, in accordance with some embodiments. The pressure sensor 700 includes a circular metal layer M1 that is a lower metal plane supporting all the structures of pressure sensor 700 and preventing the vHF process from reaching the IMD oxide beneath metal layer M1. The metal layer M1 may have a diameter of 90 μm. A ring via V1 is placed above metal layer M1 having a diameter of 25 μm. A metal layer M2 is positioned above the ring via V1. The metal layer M2 includes a ring via 702 with a circular metal plane 704 set within ring via 702. The ring via 702 may have a diameter of 42 μm, and the circular metal plane 704 may have a diameter of 25 μm. Via structure V2 is positioned above metal layer M2. The via structure V2 includes a first via ring 706 with a second via ring 708 positioned within the first via ring 706. The first ring via 706 may have a diameter of 42 μm, and the second ring via 708 may have a diameter of 25 μm.

A metal layer M3 is positioned above via structure V2. The metal layer M3 includes a ring via 710 with a circular metal plane 712 positioned within ring via 710. The ring via 710 may have a diameter of 42 μm, and circular metal plane 712 may have a diameter of 25 μm. Via structure V3 is positioned above metal layer M3. The via structure V2 includes a first via ring 714 with a second via ring 716 positioned within the first via ring 714. The first ring via 714 may have a diameter of 42 μm, and the second ring via 716 may have a diameter of 25 μm.

A metal layer M4 is positioned above via structure V3. The metal layer M4 includes a ring via 718 with a circular metal plane 720 positioned within ring via 718. The ring via 718 may have a diameter of 42 μm, and circular metal plane 720 may have a diameter of 25 μm. Via structure V4 is a ring via 722 positioned above metal layer M4. The ring via 722 may have a diameter of 42 μm.

A metal layer M5 is positioned above via structure V4. The metal layer M4 includes a ring via 724 and a membrane 726 of pressure sensor 700, being a circular metal plane positioned within ring via 718. The ring via 724 may have a diameter of 42 μm, and membrane 726 may have a diameter of 25 μm. Via structure V5 is positioned above metal layer M5. The first ring via 714 may have a diameter of 42 μm. The via structure V5 includes a first via ring 728 with a double ring via 730 positioned within first via ring 728. The double ring via 730 is configured to define the vertical walls of the membrane cavity, trapping the silicon oxide inside after the vHF etching process. This is shown in more detail in FIG. 8.

A metal layer M6 is positioned above via structure V5. The metal layer M6 includes a circular metal plane 732 configured as a lid for pressure sensor 700. Moreover, the metal layer M6 includes an inner array of holes 734 and an outer array of holes 736. The holes of inner array of holes 734 are positioned to provide access to membrane 726. Also, the holes of the outer array of holes 736 are aligned to provide access to metal layer M1. This is shown in more detail in FIG. 8.

In some embodiments, metal layers M1-M6 have a shape that is not circular. Metal layers M1-M6 are built using the BEOL metal layers of a solid-state semiconductor process.

In some embodiments, metal layer M6 is not used and is an optional feature.

Figure 8:
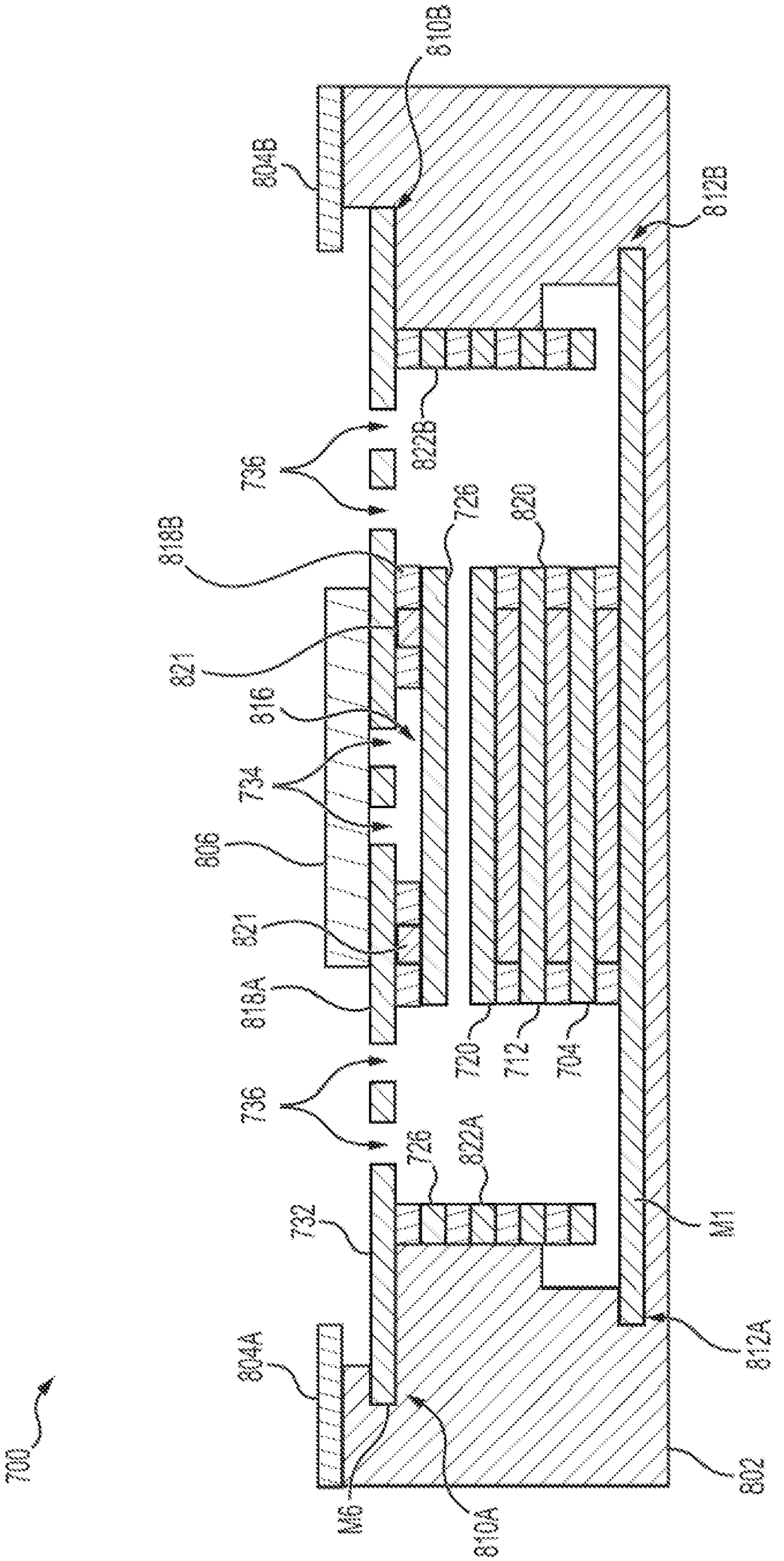
FIG. 8 is a schematic diagram of a cross-sectional view of the MEMS pressure sensor of FIG. 7, in accordance with some embodiments.

FIG. 8 is a schematic diagram of a cross-sectional view of pressure MEMS sensor 700, in accordance with some embodiments. In particular, FIG. 8 shows the silicon dioxide layer 802 similar to silicon dioxide layer 202 described in FIG. 2, which is processed using the vHF etching process described herein. Moreover, passivation layers 804A and 804B are positioned on silicon dioxide layer 802 to protect and shield silicon dioxide layer 802 against corrosion. A seal 806 may be positioned over the inner array of holes 734. Note seal 806 is formed using the same approaches described herein for seal 206. In some embodiments, the seal 806 is not used and is an optional component.

The pressure sensor 700 includes cavity 816 for trapping gases to measure the pressure. The cavity 816 includes cavity walls 818A and 818B formed using via structure V5. The cavity walls 818A and 818B, in conjunction with seal 806, are configured to minimize outgassing and provide increased accuracy in pressure measurement. Moreover, each cavity wall 818A and 818B includes regions 821 filled with oxide from the silicon oxide layer 802 not etched by the vHF etching process.

The end portions of metal layer M6 extend and are buried firmly within silicon dioxide layer 802, forming capacitive anchors 810A and 810B. End portions of metal layer M1 extend and are buried firmly within silicon dioxide layer 502, forming capacitive anchors 812A and 812B. The capacitive anchors 810 and 812 are configured to provide mechanical support for metal layers M6 and M1 and the necessary capacitance to measure membrane pressure 726. The edges of cavity walls 818A and 818B provide sufficient mechanical support to fix membrane 726.

Pedestal 820 is formed using via rings V1, 708, and 716 in conjunction with metal layer M1 and metal planes 704, 712, and 720. In particular, the pedestal 820 are configured to sustain the membrane 726 and lid (metal layer M6) and add distance between the membrane and fixed electrode below. The pressure sensor 700 uses a different anchor type than pressure sensors 100 and 400. The pedestal 820 can lead to a more compact design, although etching may still determine the horizontal size under the passivation layer 802. Nevertheless, the correct dimensions and process parameters could lead to lower parasitic capacitance. Pedestal 820 and the vHF etching need to be adjusted to trade between parasitic capacitance and yield. In addition, pedestal 820 includes several regions 824 filled with oxide from the silicon oxide layer 802 not etched by the vHF etching process.

Vertical capacitive anchors 822A and 822B are formed using via rings 702, 706, 710, 714, 718, 722, 724, and 728 and metal planes 704, 712, 720, and 726. The vertical capacitive anchors 822A and 822B are configured to protect and prevent the vHF etching process from etching the sidewalls of the silicon dioxide layer 802 to which vertical capacitive anchors 822A and 822B are adjacent. Moreover, the vertical capacitive anchors 822A and 822B provide additional support to metal layer M6 configured to be the lid for pressure sensor 700.

Figure 9:
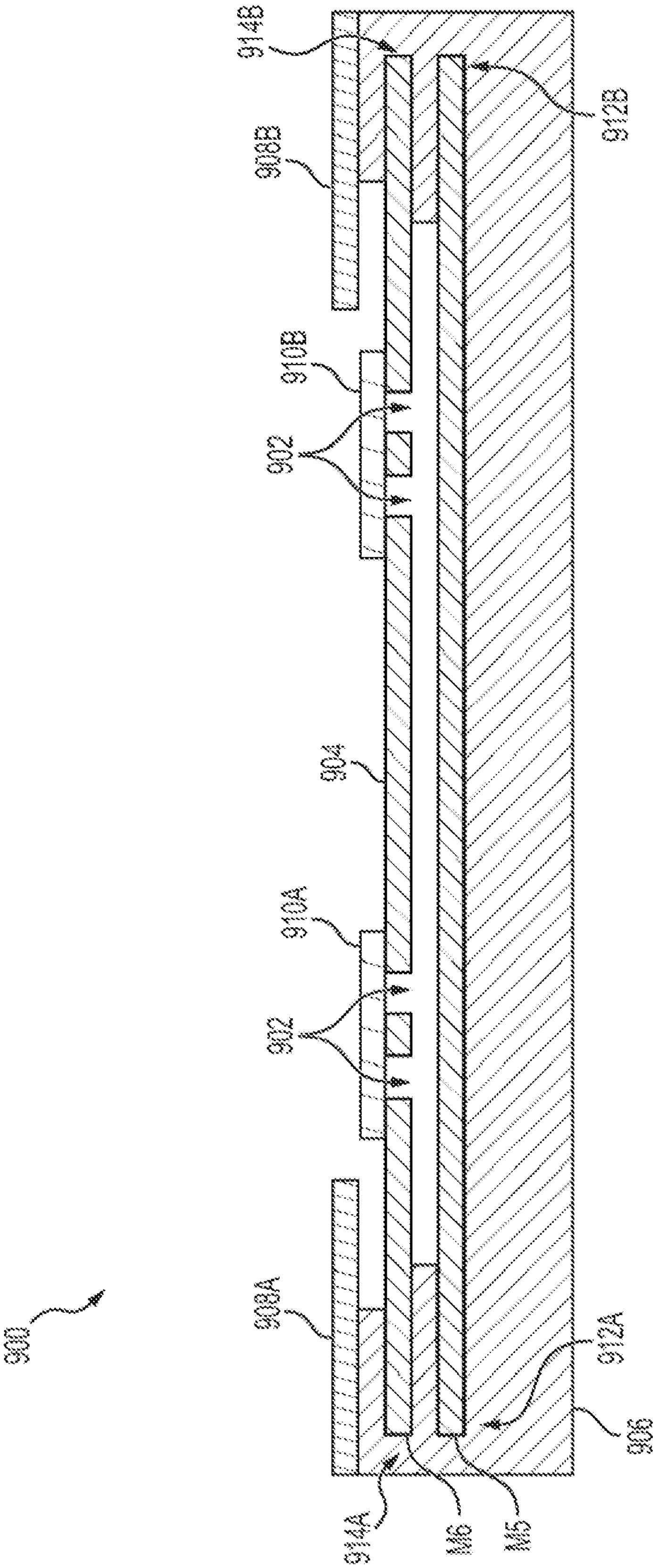
FIG. 9 is a schematic diagram of a cross-sectional view of a MEMS pressure sensor with an array of holes around the peripheral of a membrane, in accordance with some embodiments.

FIG. 9 is a schematic diagram of a cross-sectional view of MEMS pressure sensor 900 with an array of holes 902 around the peripheral of a membrane 904, in accordance with some embodiments. In particular, FIG. 9 shows the silicon dioxide layer 906, similar to silicon dioxide layer 202 described in FIG. 2, which is processed using the vHF etching process described herein. Moreover, passivation layers 908A and 908B are positioned on silicon dioxide layer 906 to protect and shield silicon dioxide layer 904 against corrosion. Seals 910A and 910B may be placed over the array of holes 902. Note seals 910A and 910B are formed using the same approaches described herein for seal 206. In some embodiments, the seals 910A and 910B are not used and are an optional component.

In some embodiments, the seals 910 and 910B are formed using deposition or by laser bleeding or other techniques.

In some embodiments, an array of holes is positioned across all of metal layer M6 that forms membrane 904

In some embodiments, an array of holes is positioned at the peripheral of metal layer M6 or within a define radial distance from the center of metal layer M6 (as shown in FIG. 9). This allows for a longer etching time, etching away the TiN sublayers of the metal layers leaving only the Al layers exposed, which reduces the stiffness of the layers increasing the sensitivity of pressure 900. In some embodiments, annealing, like 1 hour at 300 deg C., further reduces the metal layers' stiffness.

The pressure sensor 900 includes metal layers M5 and M6. The metal layer M5 is configured to be a lower-level electrode. The end portions of metal layer M5 are buried and anchored firmly within silicon dioxide layer 906, forming capacitive anchors 912A and 912B. The end portions of metal layer M6 are buried and anchored firmly within silicon dioxide layer 906, forming capacitive anchors 914A and 914B. A portion of metal layer M6 is used as membrane 904 for pressure sensor 900. The configuration of pressure sensor 900 avoids having to seal membrane 904, as it would not have holes. Also, the holes of array of holes 902 are formed on metal layer M6 and around the peripheral of membrane 914.

Figure 10A:
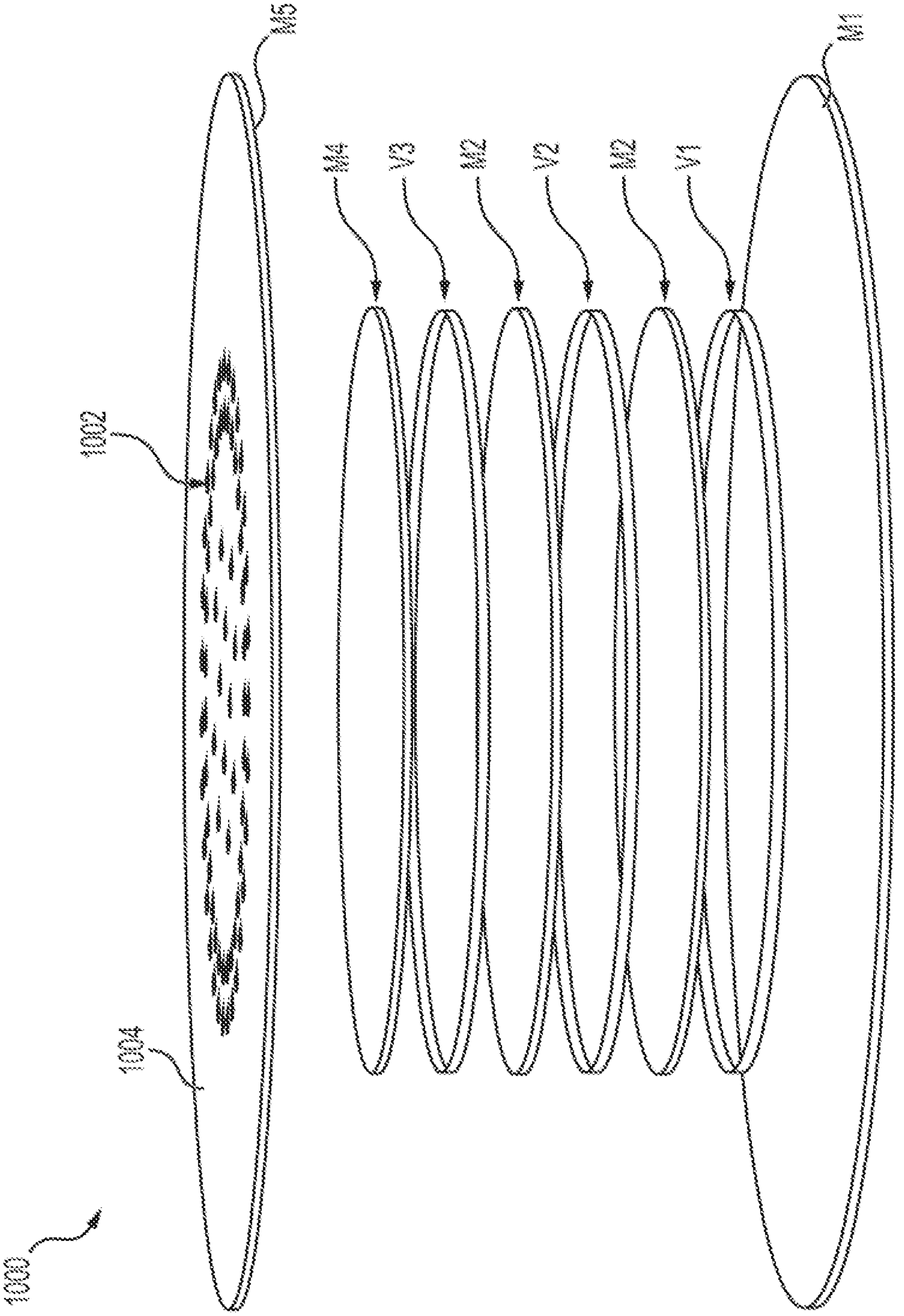
FIGS. 10A-10B are schematic diagrams of a spread-out view and side view of a MEMS pressure sensor without showing the silicon dioxide, passivation, and substrate, in accordance with some embodiments.
Figure 10B:
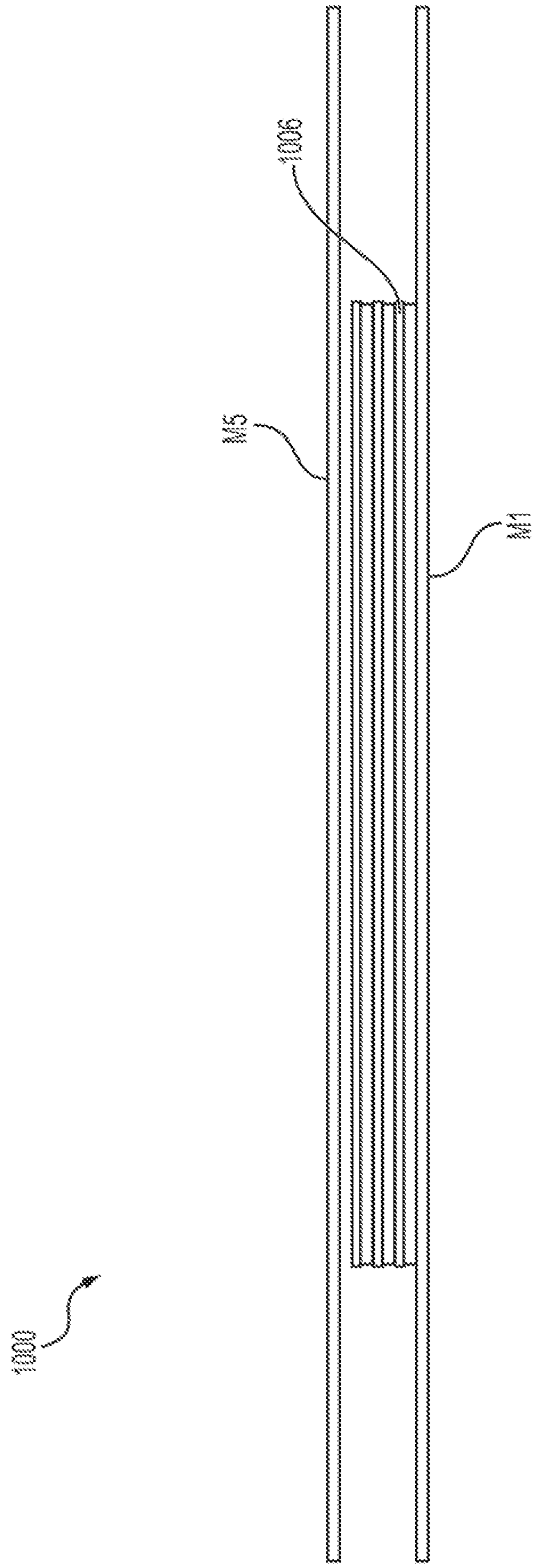

FIGS. 10A-10B are schematic diagrams of a spread-out view and side view of MEMS pressure sensor 1000 without showing the silicon dioxide, passivation, and substrate, in accordance with some embodiments. The pressure sensor 1000 includes a circular metal layer M1 that is configured to be a lower electrode with a diameter of 100 μm, as shown in FIG. 10A. A ring via V1 is positioned on metal layer M1. A circular metal layer M2 is positioned on the ring via V1. A ring via V2 is placed on metal layer M1. A circular metal layer M3 is positioned on the ring via V2. A ring via V3 is positioned on metal layer M1.

A metal layer M4 is positioned on ring via V3. A metal layer M5 is positioned on metal layer M4. Moreover, metal layer M5 is configured to include the membrane 1004 of pressure sensor 1000. In addition, the metal layer M5 includes an array of holes 1002 having several holes on the top surface of metal layer M5. It is preferred the top most layer of pressure sensor 1000 be configured to be membrane 1004 while minimizing stiffness.

In some embodiments, metal layers M1-M5 of pressure sensor 1000 have a shape that is not circular. Metal layers M1-M6 are built using the BEOL metal layers of a solid-state semiconductor process.

When one applies pressure, membrane 1004 is deflected in its central position, and the deflection around the edges may be minimal. This means that the contribution to the capacitance variation of the outer area of the membrane 1004 is minimal. However, these external areas of membrane 1004 may contribute to the initial capacitance.

Pressure sensor 1000 enforces a more significant contribution to the initial capacitance at the central part of the membrane 1004, where the displacement or deflection is largest. The way to do this is to implement metal layer M1 so that it is not just under the membrane 1004 but at some levels below. A pedestal 1006 with a cylindrical shape is formed by stacking up metal layers M1-M4 and ring vias V1-V3, as shown in FIG. 10B. Note pedestal 1006 is configured to reduce the capacitance gap in the center of membrane 1004 and increase it in the periphery. The pedestal 1006 may be located at the center of the membrane 1004 and attached to metal layer M1.

It is preferred that an additional top metal layer, such as M6, not be used to minimize the thickness of pressure sensor 1000. In some embodiments, the membrane include holes positioned not at the center nor the edge of the membrane 1004.

In some embodiments, pressure sensor 1000 includes additional vias to form pedestal 1006. In some embodiments, the membrane 1004 is implemented on the other metal layers M1-M4. In some embodiments, the membrane 1004 is implemented on the top most metal layer if metal layer M5 is not the top most metal layer.

Figure 11A:
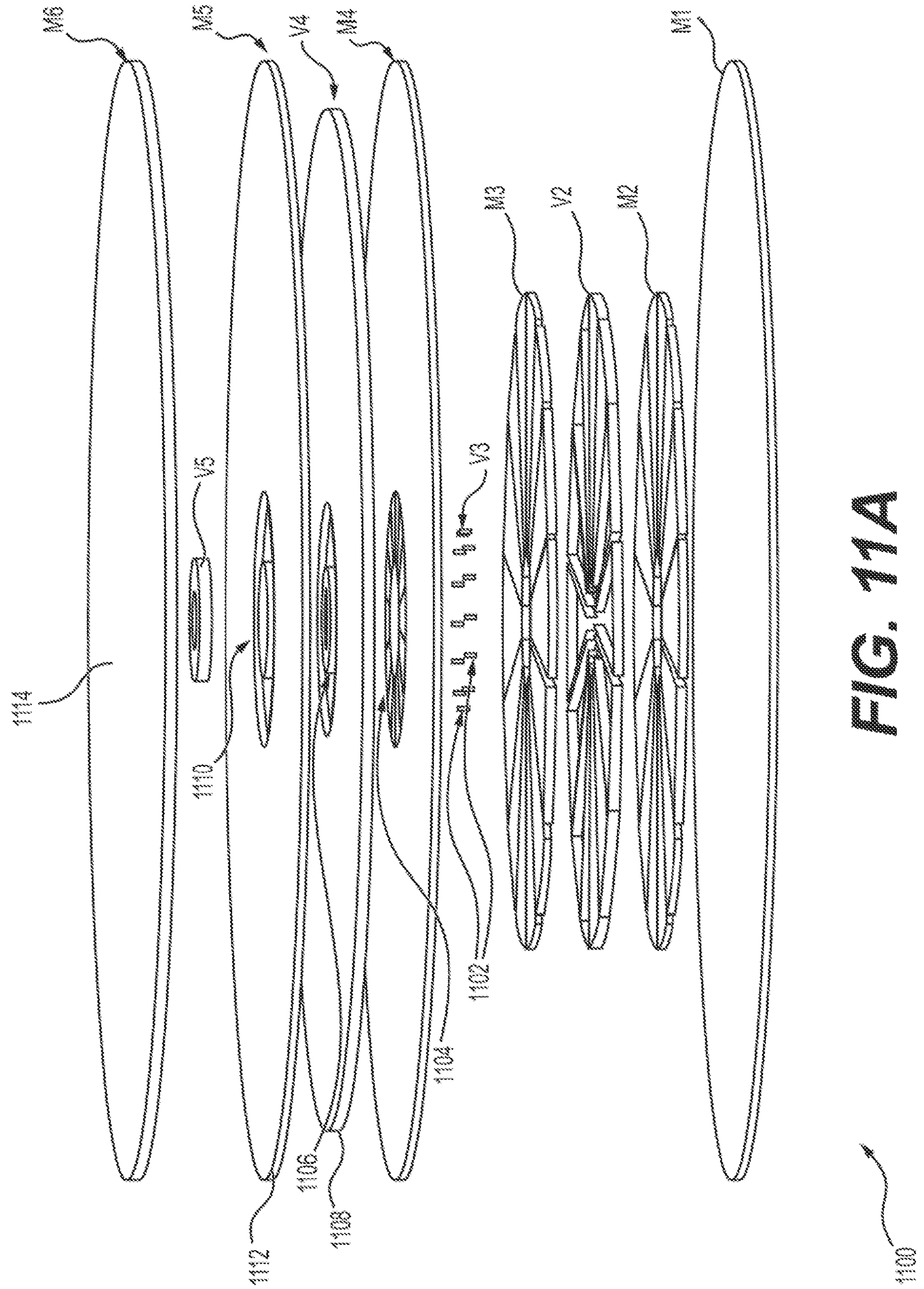
FIGS. 11A-11B are schematic diagrams of a spread-out view and side view of the metal layers of a MEMS pressure sensor without showing the silicon dioxide, passivation, and substrate, in accordance with some embodiments.
Figure 11B:
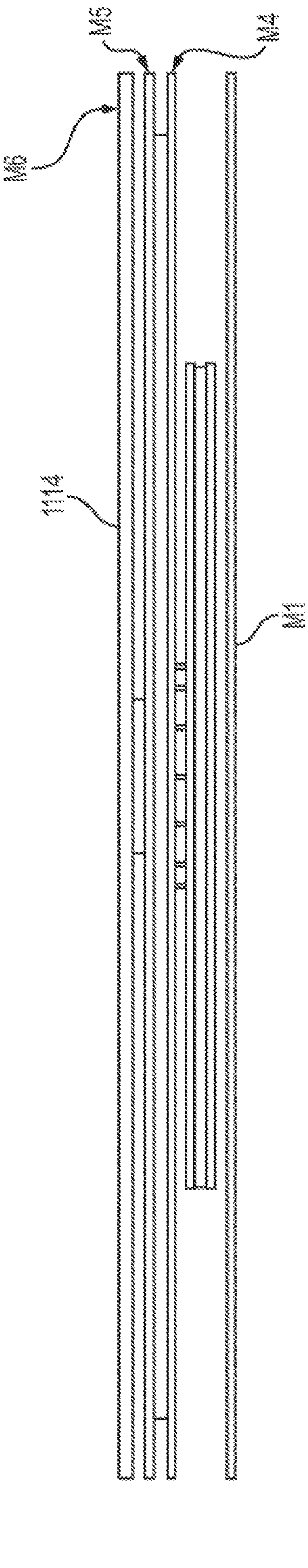

FIGS. 11A-11B are schematic diagrams of a spread-out view and side view of the metal layers of MEMS pressure sensor 1100 with a full leverage membrane without showing the silicon dioxide, passivation, and substrate, in accordance with some embodiments. The pressure sensor 1100 includes a circular metal layer M1 configured to be a lower electrode, as shown in FIG. 11A. A metal layer M2 is positioned on metal layer M1. The metal layer M2 is configured to be a movable electrode. A via layer V2 is positioned on metal layer M2. The via layer V2 has a similar design to metal layer M2 and is movable. A metal layer M3 is positioned on via layer V2. The metal layer M3 has a similar structure to metal layer M2 and is movable. A via layer V3 includes a number of vias 1102 circularly positioned on metal layer M3. A metal layer M4 is positioned on via layer V3. The metal layer M4 consists of several bridges or springs 1104 positioned on vias 1102.

A via layer V4 is positioned on metal layer M4. The via layer V4 has a first portion 1106 positioned on bridges or springs 1104. A second portion 1108 of via layer V4 is positioned on the remaining portions of metal layer M4. A metal layer M5 is positioned on via layer V4. The metal layer M5 includes a first portion 1110 positioned on the first portion 1106 of via layer V4. A second portion 1112 of metal layer M5 is positioned on the remaining portions of metal layer M4. A via layer V5 is a ring via positioned on the first portion 1110 of metal layer M5. A metal layer M6 is positioned on via layer V5. The metal layer M6 is configured to include membrane 1114 of pressure sensor 1100.

Metal layers M1 and M4-M6 are configured to have a circular shape and radial dimensions, as shown in FIG. 11B. In some embodiments, metal layers M1 and M4-M6 are configured to have a shape different from circular. Metal layers M2 and M3 have the exact radial dimensions but are comparably smaller than metal layers M1 and M4-M6. The via layer V2 has a circular shape and is similarly sized to metal layers M2 and M3 while via layers. The via layer V4 has a circular shape and is radially larger than via layer V2 but smaller than metal layers M1 and M4-M6.

In some embodiments, metal layers M1-M5 of pressure sensor 1000 have a shape that is not circular. Metal layers M1-M6 are built using the BEOL metal layers of a solid-state semiconductor process.

Figure 11C:
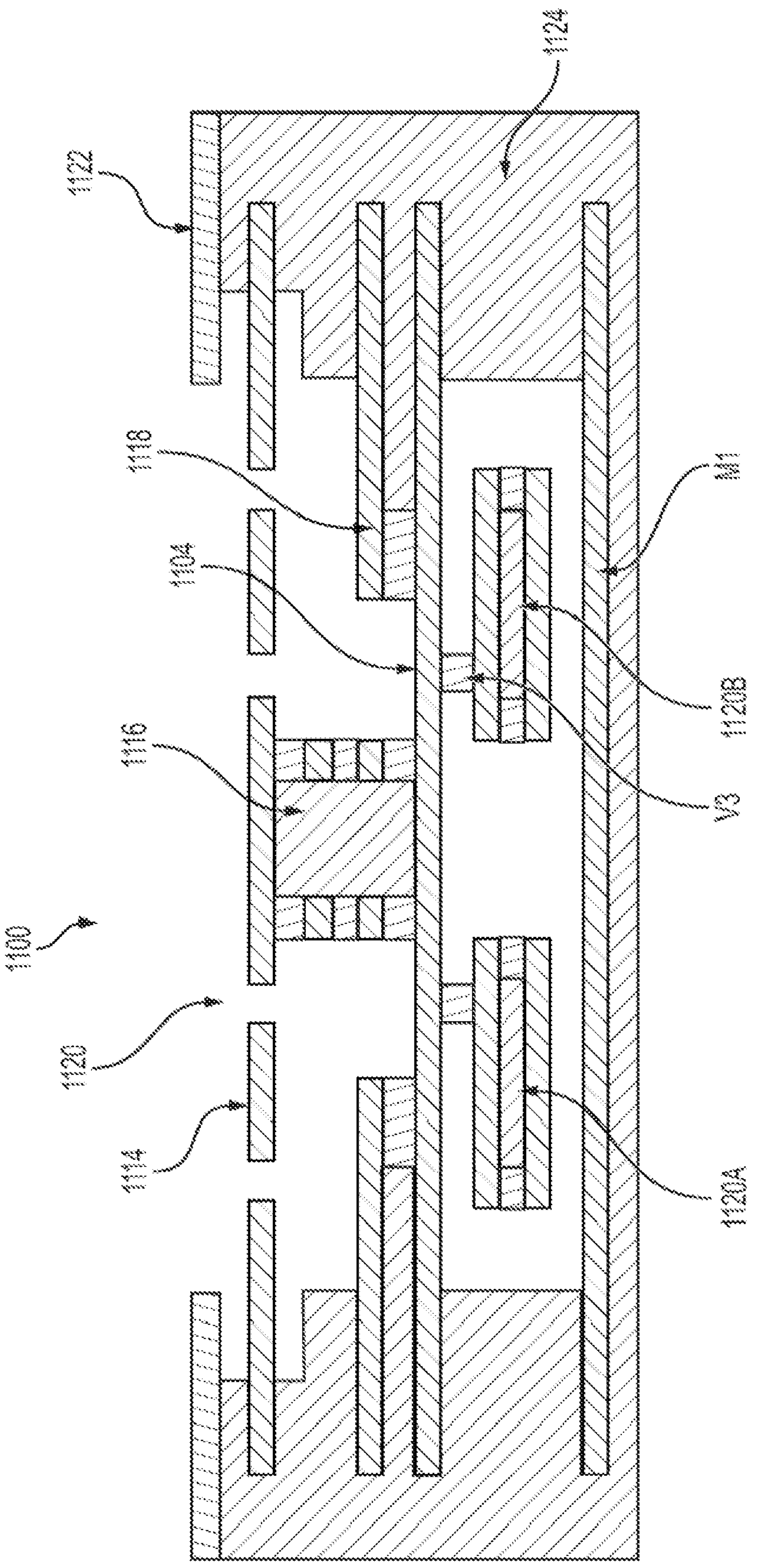
FIG. 11C is a schematic diagram of a cross-sectional view of the pressure sensor shown in FIGS. 11A-11B, in accordance with some embodiments.

FIG. 11C shows a cross-sectional view of pressure sensor 1100, in accordance with some embodiments. In this case, passivation layer 1122 is positioned silicon dioxide layer 1120. In the embodiment shown in FIG. 11C of pressure sensor 1100, an array of holes 1120 may be positioned on membrane 1114. Note pressure sensor 1100 utilizes membrane 1114 to generate or sense the pressure of ultrasound. In some embodiments, membrane 1114 may not include an array of holes.

Moreover, pressure sensor 1100 includes an internal piston 1116 in its center to capture the displacement of the membrane 1114 and to transmit it towards the inside of pressure sensor 1100. The bridges or springs 1104 attach to the central piston 1122 on one side and fixed supports 1112 on the other side so that when the piston 1122 is displaced vertically, the bridges or springs 1104 are tilted. The metal layers M2 and M3 and via layer V2 tilt parallel to bridges or springs 1104, including metal layer M1. Internal electrodes 1120A and 1120B are implemented using the stacked-up metal layers M2 and M3, since using only one metal layer would bend too much.

In some embodiments, metal layers M4 and M5 include a hole in the center to allow for the displacement of a central piston 1116, which is made with the same metal layers M4 and M5 plus via layers V4 and V5 that connects metal layer M5 to the membrane 1114 made with metal layer M5. This hole in the center of pressure sensor 1100 is filled with straight lines that conform to bridges at the level of metal layer M4.

In some embodiments, bridges or springs 1104 made with metal layer M4 tilts when the central piston is displaced vertically. Each is attached to a section of the internal electrode built with metal layers M2 and M3 and via layer V3. This way, when the bridges or springs 1104 tilt, the internal electrodes 1120A and 1120B also tilt since they move and tilt parallel to bridges or springs 1104 to which they are attached.

In some embodiments, the membrane 1104 is implemented on the top most metal layer if metal layer M6 is not the top most metal layer.

A similar approach for implementing pressure sensor 1100 is described in U.S. Pat. No. 11,312,617, the entire contents of which are incorporated herein by reference.

Figure 12A:
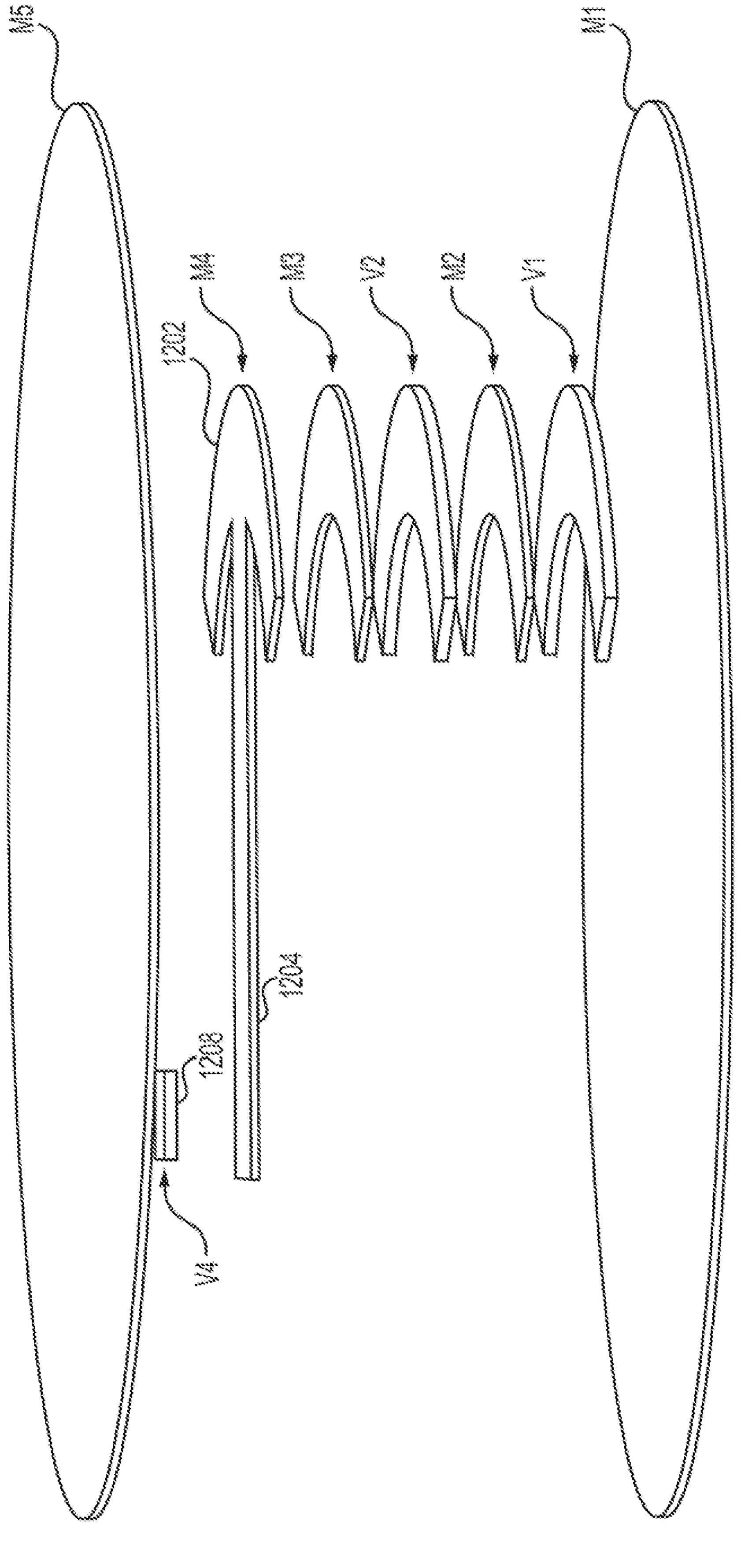
FIGS. 12A-12B are schematic diagrams of a spread-out view and side view of the metal layers of a MEMS pressure sensor without showing the silicon dioxide, passivation, and substrate, in accordance with some embodiments.
Figure 12B:
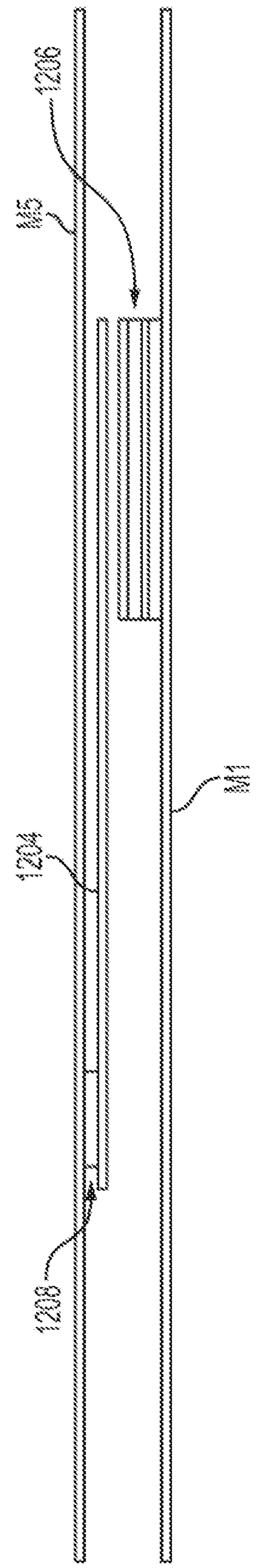

FIGS. 12A-12B are schematic diagrams of a spread-out view and side view of the metal layers of MEMS pressure sensor 1200, in accordance with some embodiments. The pressure sensor 1200 includes a circular metal layer M1, a via layer V1, a metal layer M2, a via layer V2, a metal layer M3, a metal layer M4, a via layer V4, and a circular metal layer M5, as shown in FIG. 12A. Metal layers M2 and M3 and via layer V2 are each configured to be wing-shaped and similar sized. Also, metal layers M2 and M3 and via layers V1 and V2 are stacked to form pedestal 1206 positioned on metal layer M1, as shown in FIG. 12B. In this case, the pedestal 1206 is positioned away from the center of pressure sensor 1200. Metal layer M4 includes a wing-shaped portion 1202 and a membrane 1204 integrally connected to wing-shaped portion 1202. Pedestal 1206 is located below wing-shaped portion 1202, which is where the maximum displacement occurs. Via layer V4 is a via 1208 positioned on a distal end of membrane 1204. Metal layer M5 is positioned on via layer V4.

Pressure sensor 1200 does not include a piston as in pressure sensor 1100. Winged-shaped portion 1202 may start from an optimal anchor point with a maximum slope of membrane 1204 when a pressure differential is applied to the distal end of membrane 1204. Moreover, one can increase the size of wing-shaped portion 1202 and/or add pedestal 1206 at the end of wing-shaped portion 1202, which results in a maximum displacement. This intensifies the influence of the edge part of wing-shaped portion 1202 to the total capacitance, hence maximizing the sensitivity of pressure sensor 1200.

In some embodiments, an ASIC is provided operating as a tire pressure monitoring system (TPMS). This ASIC includes a MEMS pressure sensor, as described herein. The pressure sensor is built monolithically in the BEOL of the ASIC.

In some embodiments, an ASIC is provided operating as an e-cigarette sensor. This ASIC includes a MEMS pressure sensor, as described herein. The pressure sensor is built monolithically in the BEOL of the ASIC. Pressure sensors are used in e-cigarettes to detect air intake from the user. This is done by using a differential pressure sensor. When the user inhales, pulling the air, the front part of the differential pressure sensor sees a pressure reduction faster than the back reference. Consequently, it sees a pressure difference, and at a given threshold, it triggers a signal to turn on the e-cigarette filament.

There is an interest in using MEMS pressure sensors in SMD technology and hence reducing cost, in addition to size and soldering errors during the assembly. Currently, electret-type pressure sensors are used in most e-cigarettes. However, MEMS pressure sensor ICs are smaller. The consequence of this is that the narrower air path to get to the back reference of the pressure sensor can more easily be clogged or isolated for some time, due to the oil and dirt that is found inside the e-cigarette. When this happens, the back pressure reference no longer sees the real pressure of the ambient.

Then when the ambient pressure changes due to environmental conditions and/or the user moves to a higher or lower altitude, the front side of the pressure sensor detects it, and it triggers the threshold, heating the filament when the user is not inhaling. A way to prevent this is to use a non-differential pressure sensor, like the ones disclosed in this patent. A circuit (digital preferably) can keep track of the ambient pressure. Preferably, one can do this by doing a moving average of the pressure measured. The moving average may not react instantaneously to the pressure measured, allowing for the detection of an inhalation event. Note other types of average may be used. There is no risk of having the back reference pressure input port being clogged or isolated from the real pressure, because there is no such port, and only the main one is well exposed to the air to measure the pressure. One may use the MEMS pressure sensors described herein to operate as differential pressure sensors in e-cigarettes.

In some embodiments, an integrated circuit is provided operating as a microphone. This integrated circuit includes a MEMS pressure sensor, as described herein. The pressure sensor is built monolithically in the BEOL of the integrated circuit.

In some embodiments, an integrated circuit is provided operating as an ultra-sound sensor. This integrated circuit includes a MEMS pressure sensor, as described herein. The pressure sensor is built monolithically in the BEOL of the integrated circuit.

Elements or steps of different implementations described may be combined to form other implementations not specifically set forth previously. Elements or steps may be left out of the systems or processes described previously without adversely affecting their operation or the operation of the system in general. Furthermore, various separate elements or steps may be combined into one or more individual elements or steps to perform the functions described in this specification.

Reference in the specification to "one implementation" or "an implementation" means that a particular feature, structure, or characteristic described in connection with the implementation is included in at least one implementation of the disclosure. The appearances of the phrase "in one implementation," "in some implementations," "in one instance," "in some instances," "in one case," "in some cases," "in one embodiment," or "in some embodiments" in various places in the specification are not necessarily all referring to the same implementation or embodiment.

Finally, the above descriptions of the implementations of the present disclosure have been presented for the purposes of illustration and description. It is not intended to be exhaustive or to limit the present disclosure to the precise form disclosed. Many modifications and variations are possible in light of the above teaching. It is intended that the scope of the present disclosure be limited not by this detailed description, but rather by the claims of this application. As will be understood by those familiar with the art, the present disclosure may be embodied in other specific forms without departing from the spirit or essential characteristics thereof. Accordingly, the present disclosure is intended to be illustrative, but not limiting, of the scope of the present disclosure, which is set forth in the following claims.

What is claimed is:

1. A MEMS pressure sensor comprising:

a membrane made with one of plurality of metal layers;

a lid positioned above the membrane and connected to a plurality of cavity walls at distal ends of the membrane, wherein the lid includes an array of holes positioned on a region of the lid; and a fixed metal electrode positioned below the lid;

wherein a set of metal layers of the plurality metal layers are configured to be a pedestal;

wherein the cavity walls are formed using at least one via structure; and wherein the at least one via structure comprises a double ring via.

2. The MEMS pressure sensor of claim 1, wherein the lid is formed using a metal layer from the plurality of metal layers different from the membrane, and the membrane is formed using a first metal layer under the lid.

3. The MEMS pressure sensor of claim 1, wherein the membrane and the lid comprises a circular shape.

4. The MEMS pressure sensor of claim 3, wherein at least one of the lid and membrane comprises a diameter of about 25 μm, 50 μm, 75 μm, or 100 μm.

5. The MEMS pressure sensor of claim 1, wherein the metal layers are formed using the backend-of-the-line metal layers of a solid-state semiconductor process.

6. The MEMS pressure sensor of claim 1, wherein the array of holes protects the membrane from contaminants.

7. The MEMS pressure sensor of claim 1, wherein the lid comprises a second array of holes positioned on a second region on the lid different from the region defined by the array of holes.

8. The MEMS pressure sensor of claim 7, wherein the second region of the lid is positioned away from the membrane.

9. The MEMS pressure sensor of claim 7, wherein the membrane comprises a third array of holes that align with the first array of holes of the lid.

10. The MEMS pressure sensor of claim 1, wherein the pedestal reduces a capacitance gap at the center of the membrane.

11. The MEMS pressure sensor of claim 10, wherein the membrane is deflected from its central position when pressure is applied.

12. The MEMS pressure sensor of claim 11, wherein the membrane is connected to a lid through a via connected at a distal end of the membrane.

13. The MEMS pressure sensor of claim 10, wherein the membrane is integrally connected to a wing-shaped portion of one of the plurality of metal layers.

14. The MEMS pressure sensor of claim 1, wherein the set of metal layers are wing-shaped.

15. A MEMS pressure sensor comprising:

a metal layer made from one of a plurality of metal layers; and a pedestal, positioned below the metal layer, made from a set of different metal layers of the plurality of metal layers, wherein the pedestal reduces a capacitance gap at the center of the metal layer;

wherein the metal layer is deflected from its central position when pressure is applied; and wherein the plurality of metal layers comprise of metal layers M1-M6, where the metal layer M6 is top most metal layer and the metal layer M5 is second most top metal layer, and wherein the pedestal is made with metal layers M1-M4 and a plurality of via structures V1-V3.

* * * * *